(12) United States Patent
Kuwajima et al.

(10) Patent No.: US 7,667,951 B2
(45) Date of Patent: Feb. 23, 2010

(54) ELECTRONIC COMPONENT

(75) Inventors: Hajime Kuwajima, Tokyo (JP); Akira Furuya, Tokyo (JP); Masahiro Miyazaki, Tokyo (JP); Makoto Shibata, Tokyo (JP)

(73) Assignee: TDK Corporation, Tokyo (JP)

( * ) Notice: Subject to any disclaimer, the term of this patent is extended or adjusted under 35 U.S.C. 154(b) by 236 days.

(21) Appl. No.: 11/598,073

(22) Filed: Nov. 13, 2006

(65) Prior Publication Data
US 2007/0109719 A1 May 17, 2007

(30) Foreign Application Priority Data
Nov. 17, 2005 (JP) ............... 2005-333108

(51) Int. Cl.
H01G 4/06 (2006.01)
H01G 4/005 (2006.01)
(52) U.S. Cl. .................... 361/311; 361/303
(58) Field of Classification Search ......... 361/303–305, 361/311, 313
See application file for complete search history.

(56) References Cited

U.S. PATENT DOCUMENTS

| | | | |
|---|---|---|---|
| 5,479,052 A * | 12/1995 | Yuuki | 257/745 |
| 6,166,424 A | 12/2000 | Mikawa et al. | |
| 6,333,528 B1 * | 12/2001 | Arita et al. | 257/295 |
| 6,421,225 B2 * | 7/2002 | Bergstedt | 361/313 |
| 6,444,920 B1 | 9/2002 | Klee et al. | |
| 6,498,714 B1 | 12/2002 | Fujisawa et al. | |
| 6,552,384 B2 | 4/2003 | Murata et al. | |
| 6,562,677 B1 | 5/2003 | Mikawa et al. | |
| 6,818,498 B2 | 11/2004 | Mikawa et al. | |
| 2003/0052077 A1 * | 3/2003 | Hanhikorpi | 216/2 |
| 2003/0148739 A1 | 8/2003 | Kosemura et al. | |
| 2006/0002097 A1 * | 1/2006 | Borland et al. | 361/763 |

FOREIGN PATENT DOCUMENTS

| | | |
|---|---|---|
| JP | A-8-321705 | 12/1996 |
| JP | A-11-74467 | 3/1999 |
| JP | B2 3193973 | 3/1999 |
| JP | A-2000-223361 | 8/2000 |
| JP | A-2001-110675 | 4/2001 |
| JP | A 2002-25854 | 1/2002 |
| JP | A 2002-33559 | 1/2002 |
| JP | A-2002-334806 | 11/2002 |
| JP | A 2003-17366 | 1/2003 |
| JP | A-2004-281446 | 10/2004 |

OTHER PUBLICATIONS

Japanese Office Action issued Feb. 24, 2009.
Decision of Refusal for Japanese Patent Application No. 2005-333108 dated Nov. 17, 2009.

* cited by examiner

*Primary Examiner*—Eric Thomas
(74) *Attorney, Agent, or Firm*—Oliff & Berridge, PLC

(57) ABSTRACT

The invention relates to an electronic component including a capacitor and provides an electronic component in which electromigration can be prevented and whose capacitor element has an accurate capacity value. The electronic component includes a bottom conductor formed on a substrate, a dielectric film formed to cover the bottom conductor, an organic insulation film formed on the dielectric film, and a top conductor formed in an opening provided in the organic insulation film over the bottom conductor, the top conductor forming a capacitor element in combination with the bottom conductor and the dielectric film.

21 Claims, 19 Drawing Sheets

ELECTRONIC COMPONENT

BACKGROUND OF THE INVENTION

1. Field of the Invention

The present invention relates to an electronic component having a capacitor element.

2. Description of the Related Art

Various types of surface-mount electronic components are mounted on a circuit inside an electronic apparatus such as a personal computer or portable telephone. Known surface-mount electronic components include thin-film type electronic components formed using thin film forming techniques.

Thin-film electronic components include thin-film capacitors, thin-film inductors, thin-film LC composite components, and thin-film multi-layer components. Composite components having a capacitor include low-pass filters (LPFs), high-pass filters (HPFs), band-pass filters (BPFs), and trap filters which eliminate signals in a predetermined frequency range. Further, those components may be combined to provide electronic components such as diplexers, duplexers, antenna switch modules, and RF modules.

There is demand for compactness and reductions the height and cost of electronic components to be used at frequencies as high as 500 MHz or more and, more particularly, at frequencies in a micro-wave frequency band (GHz band). In the case of capacitors to be used at high frequencies, compactness and greater capacities have been pursued by employing a dielectric film made of a material having a high dielectric constant or reducing the thickness of a dielectric film. Further efforts toward capacitors having greater capacities include the use of multi-layer dielectric films and increasing the area of capacitor electrodes.

However, the use of a dielectric film made of a material having a great dielectric constant results in an increase in a dielectric loss tangent, which consequently results in an increase in transmission loss of a capacitor in the operational frequency range thereof. Under the circumstance, a dielectric film made of a material resulting in a small dielectric loss tangent is used for a capacitor to be used at a high frequency.

FIGS. 19A and 19B show a schematic configuration of a thin-film type capacitor element 411 according to the related art. FIG. 19A is a plan view of the capacitor element 411, and FIG. 19B is a sectional view of the same taken along the line A-A in FIG. 19A. As shown in FIGS. 19A and 19B, the capacitor element 411 includes a bottom conductor 421 formed on a substrate 51, a dielectric film 431 formed on the bottom conductor 421, and a top conductor 423 formed on the dielectric film 431. Part of the bottom conductor 421 and the top conductor 423 serves as an electrode of the capacitor element 411. An area 11×12 which is the area of the dielectric film 431 sandwiched between the bottom conductor 421 and the top conductor 423 is defined as the area of the electrode that is one factor determining the capacity value of the capacitor element 411.

In the capacitor element 411 according to the related art, the dielectric film 431 tends to be smaller in thickness on a top surface of the bottom conductor 421 than at edges of the bottom conductor 421. When the thickness of the dielectric film 431 is reduced, the dielectric film 431 may not be formed on the bottom conductor 421. In this case, sufficient insulation may not be provided between the bottom conductor 421 and the top conductor 423 at the edges of the bottom conductor 421, which increase the possibility of a shorting failure. As a result, a breakdown limit of the withstand voltage of the capacitor element 411 may be lowered, and a problem therefore arises in that the quality of products becomes inconsistent in terms of voltage withstanding capability. A shorting failure or a reduction in the breakdown limit of the withstand voltage is likely to occur when the thickness of the dielectric film 431 is small relative to the thickness of the bottom conductor 421 or top conductor 423 or when the edges of the bottom conductor 421 are inversely tapered.

Under the circumstance, the dielectric film 431 is formed from a material having high insulating properties or formed with a great thickness in an intention to improve the withstand voltage of the capacitor element 411. However, an increase in the thickness of the dielectric film 431 necessitates an increase in the electrode area of the capacitor element 411 in order to obtain a great capacity, which results in a problem in that it becomes difficult to make the electronic component compact.

Referring to thin-film type electronic components having a capacitor, reductions in the electrode area and the number of dielectric films have a great importance in providing a small-sized and low-profile capacitor operating at a high frequency at a low cost. The accuracy of the capacity value of the capacitor element 411 depends on the relative positional accuracy of the bottom conductor 421 and the top conductor 423, the accuracy of the shape of the bottom conductor 421 and the top conductor 423, the accuracy of the thickness and dielectric constant of the dielectric film 431, and the surface roughness of the bottom conductor 421 and the top conductor 423. In the case of the capacitor element 411, a general way to improve the relative positional accuracy of the top conductor 423 and the bottom conductor 421 is to change the electrode area of each conductor.

The top conductor formed above the bottom conductor must be smaller in dimensions than the bottom conductor in consideration to a possible shorting between the top conductor and the bottom conductor and their positional accuracy. In particular, when conductors having small dimensions are used, there is a limit on the number of top conductors that can be formed because top conductors are formed in small dimensions to allow some margin for the positional accuracy thereof. Further, the use of a multi-layer top conductor does not necessarily result in an increase in the capacity of a capacitor. In capacitors according to the related art, since a dielectric film is formed in low compliance with a bottom conductor at edges of the conductor, a top conductor is formed so as to avoid the edges in order to prevent shorting between the top conductor and the bottom conductor. Further, bottom conductors of capacitors according to the related are uneven in the shape of edges thereof. When such edges are used as part of electrodes of the capacitors, there will be significant variations in the electrode area, and the capacity value cannot be accurately controlled. Under the circumstance, in capacitors according to the related art, a dielectric film and a top conductor are formed in the order listed on a planar part of a bottom conductor excluding edges thereof, and a capacity is formed by the area (electrode area) in which the top conductor and the bottom conductor face each other and the thickness of the dielectric film.

In the electronic component having a capacitor, a parasitic inductance or stray capacity is suppressed by adjusting the circuit layout to reduce the distance from the conductors of the capacitor element 411 to terminals and to reduce the length of a lead-out conductor for connecting the capacitor 411 and a circuit element adjacent to the capacitor element 411.

However, since part of the lead-out conductor is in contact with the dielectric film 431, the capacity value of the capacitor element 411 is different from a design value when there is any misalignment between the positions where the bottom conductor 421 and the top conductor 423 are formed. For example, the lead-out conductor is formed with a small width in order to suppress the deviation of the capacity value of the capacitor from the design value. However, since a reduction in the width of the lead-out conductor results in an increase in the parasitic inductance, there will be problems including degradation of high-frequency characteristics of the electronic component and an increase in transmission loss.

In the thin-film type capacitor element disclosed in Patent Document 1, a bottom electrode and a dielectric layer are formed in the order listed on a substrate. The periphery of the dielectric layer is covered by an insulator layer having an opening. A top electrode formed on the insulator layer overlies on the dielectric layer in the opening. In such a configuration, the insulator layer covering the periphery of the dielectric layer provides reliable insulation between the bottom electrode and the top electrode. As a result, any reduction or variation of a breakdown voltage attributable to insufficient coverage of the dielectric layer can be reliably prevented. Further, since the capacity value of the capacitor is determined by the opening of the insulator layer, variation of the capacity value can be reduced regardless of the size of the bottom and the top electrodes and the accuracy of alignment of the electrodes.

However, in the capacitor element disclosed in Patent Document 1, since the top electrode is formed also in the same layer as the bottom electrode so as to face the bottom electrode with the insulator layer interposed between them, a parasitic capacity is generated between the electrodes. Since the insulator layer is formed to protrude above the substrate surface, it is difficult to provide the dielectric layer in a multi-layer structure. Further, the configuration makes it difficult to provide a composite component having a plurality of circuit elements in a small size because circuit elements such as an inductor element cannot be formed close to the capacitor element.

An insulation film formed on a bottom conductor must have heat-resisting properties. The use of an organic material as the material of an insulation film results in the problem of occurrence of electromigration. Electromigration is a transport phenomenon of metal components across a non-metal medium in which the metal components move above or inside the medium under the influence of an electric field. Electromigration can cause a reduction in an effective sectional area of a metal wiring or a reduction in an insulation resistance between adjoining conductors such as bottom and top conductors. Electromigration can consequently cause breakage or shorting of a metal wiring which results in a failure of an electronic component. In general, bottom and top conductors are formed using Cu (copper) to reduce transmission loss by suppressing DC resistive components. When Cu is used as a conductor material, electromigration is more apt to occur.

Patent Document 2 discloses an electronic circuit substrate having a capacitor element, a resistive element, and an inductor element. In the electronic circuit substrate disclosed in Patent Document 2, Cu and Ni films are formed in the order listed using an electroplating process to provide a bottom electrode. An organic insulation film is formed in isolation from Cu that is provided by the Ni film, and the occurrence of electromigration can therefore be prevented even though the organic insulation film is formed on the bottom electrode. However, a separate step is required to form a conductor for preventing electromigration, and which results in the problem of an increase in the manufacturing cost.

Patent Document 1: JP-A-2002-25854
Patent Document 2: JP-A-2002-33559
Patent Document 3: JP-A-2003-17366
Patent Document 4: Japanese Patent No. 3193973

SUMMARY OF THE INVENTION

It is an object of the invention to provide an electronic component whose capacitor element has an accurate capacity value and in which electromigration can be prevented.

(1) The above-described object is achieved by an electronic component characterized in that it includes a first conductor formed on a substrate, a dielectric film formed to cover the first conductor, an organic insulation film formed on the dielectric film, and a second conductor formed in an opening provided in the organic insulation film over the first conductor, the second conductor forming a capacity in combination with the first conductor and the dielectric film.

(2) The invention provides an electronic component according to the item (1), characterized in that the organic insulation film is separated from the first conductor by the dielectric film.

(3) The invention provides an electronic component according to the item (1), characterized in that the dielectric film is planar substantially throughout a surface of the substrate.

(4) The invention provides an electronic component according to the item (1), characterized in that part of the first and second conductors serves as an electrode of the capacity and in that an electrode area of the capacity is determined by an area of the opening.

(5) The invention provides an electronic component according to the item (1), characterized in that the second conductor extends on the organic insulation film from the opening.

(6) The invention provides an electronic component according to the item (1), characterized in that it further includes a circuit element having a third conductor formed so as to be covered by the dielectric film.

(7) The invention provides an electronic component according to the item (6), characterized in that the third conductor is formed in a same layer as the first conductor.

(8) The invention provides an electronic component according to the item (1), characterized in that the dielectric film is formed substantially throughout a surface of the substrate.

(9) The invention provides an electronic component according to the item (1), characterized in that a surface of the organic insulation film is planar.

(10) The invention provides an electronic component according to the item (1), characterized in that the first and second conductors are not formed in a same layer.

(11) The invention provides an electronic component according to the item (1), characterized in that a thickness of the dielectric film is smaller than a thickness of the first conductor.

(12) The invention provides an electronic component according to the item (1), characterized in that a thickness of the dielectric film is smaller than a thickness of the organic insulation film.

(13) The invention provides an electronic component according to the item (1), characterized in that a dielectric constant of the dielectric film is greater than a dielectric constant of the organic insulation film.

The invention makes it possible to provide an electronic component whose capacitor element has an accurate capacity value and in which electromigration can be prevented.

DESCRIPTION OF THE PREFERRED EMBODIMENTS

First Embodiment

Figure 1A:
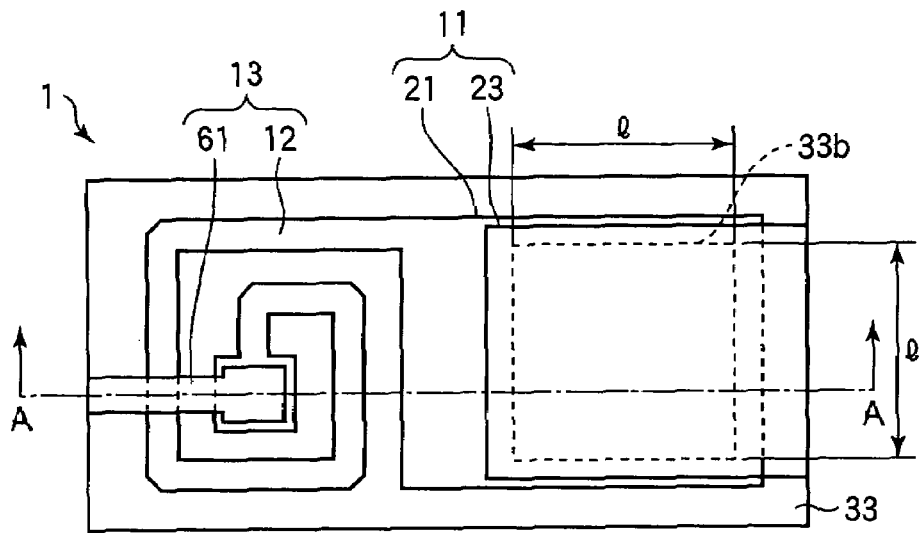
FIGS. 1A, 1B, and 1C show an electronic component 1 according to a first embodiment of the invention.
Figure 1B:
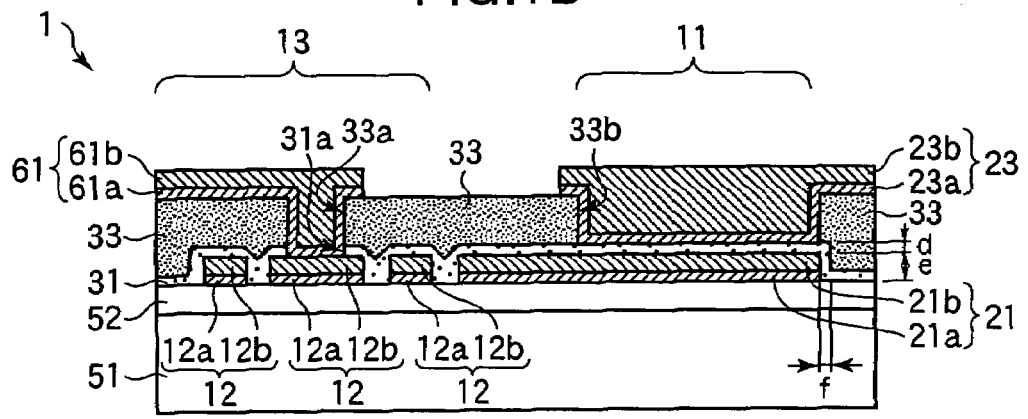
Figure 1C:
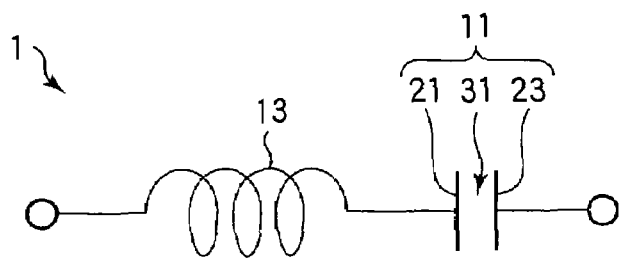

An electronic component according to a first embodiment of the invention will now be described with reference to FIGS. 1A to 10B. First, an electronic component 1 of the present embodiment will be described with reference to FIGS. 1A to 1C. FIG. 1A is a plan view of the electronic component 1, and FIG. 1B is a sectional view taken along the line A-A in FIG. 1A. FIG. 1C is an equivalent circuit diagram of the electronic component 1. In FIG. 1A, hidden lines are indicated by broken lines.

As shown in FIGS. 1A and 1B, the electronic component 1 includes a capacitor element (capacity) 11 and an inductor element (circuit element) 13 which are formed using thin-film forming techniques, and the component has a general outline in the form of a rectangular parallelepiped. Referring to FIG. 1A, the length of the longer sides of the electronic component 1 extending in the horizontal direction and the length of the shorter sides of the same extending in the vertical direction in the figure are substantially at a ratio of 2:1. As shown in FIG. 1C, the capacitor element 11 and the inductor element 13 are connected in series to form a series resonance circuit.

As shown in FIG. 1B, the electronic component 1 of the present embodiment employs a smooth substrate 51 having a planarized layer 52 formed on a surface thereof. The substrate 51 of formed from alumina (Al2O3). The planarized layer 52 is formed from alumina, and the surface of the planarized layer 52 is planarized by polishing the same using a CMP (chemical mechanical polishing) process.

The electronic component 1 includes a coil conductor (third conductor) 12 formed on the planarized layer 52 of the substrate 51 and having a spiral shape when viewed in the normal direction of the substrate 51 and via openings 31a and 33a provided in a dielectric film 31 and an organic insulation film 33, respectively, above an inner end of the coil conductor 12.

A lead-out conductor 61, which is in contact with the inner end of the coil conductor 12 at the via opening 33a, is formed in the via openings 31a and 33a and above the organic insulation film 33. The inductor element 13 is constituted by the coil conductor 12 and the lead-out conductor 61. An outer end of the coil conductor 12 is electrically connected to a bottom conductor 21. The coil conductor 12 and the bottom conductor 21 are formed to be integral with each other. The lead-out conductor 61 and a top conductor 23 constitute terminals for energizing the electronic component 1.

The coil conductor 12 is constituted by an underlying conductor 12a made of Ti and Cu and formed on the planarized layer 52 of the substrate 51 and a conductor 12b made of Cu and formed on the underlying conductor 12a. For example, the thickness of the coil conductor 12 is 8 μm. In order to suppress transmission loss by reducing DC resistive components, the bottom conductor 21 and the coil conductor 12 have a relatively great thickness. Since a series resonance circuit to be used at high frequencies is not required to have a high inductance value, the coil conductor 12 is constituted by a coil having one turn only, as shown in FIG. 1A.

The lead-out conductor 61 is electrically connected to the coil conductor 12. The lead-out conductor 61 extends on the organic insulation film 33 through the via opening 33a, and the conductor is in the form of an elongate rectangle extending from the via opening 33a up to a peripheral part of the electronic component 1 on a short side thereof. The lead-out conductor 61 is constituted by the coil conductor 12, the Ti/Cu underlying conductor 61a formed on the dielectric film 31 and the organic insulation film 33, and the Cu conductor 61b formed on the underlying conductor 61a.

A via portion of the lead-out conductor 61 is formed in the via openings 31a and 33a provided in the dielectric film 31 and the organic insulation film 33, and sides of the via portion are covered by the dielectric film 31 and the organic insulation film 33. Therefore, reliable connection and insulation can be provided at the via portion, and the via portion can be provided with high connecting reliability. Thus, the electronic component 1 can be provided with improved reliability.

The electronic component 1 includes the bottom conductor (first conductor) 21 formed on the planarized layer 52 of the substrate 51, the dielectric film 31 formed to cover the bottom conductor 21, the organic insulation film 33 formed on the dielectric film 31, and the top conductor (second conductor) 23 formed in the opening 33b provided in the organic insulation film 33 over the bottom conductor 21 and forming the capacitor element 11 in combination with the bottom conductor 21 and the dielectric film 31.

The capacitor element 11 is constituted by the bottom conductor 21, the dielectric film 31, and the top conductor 23 which are formed in the order listed on the planarized layer 52 of the substrate 51. As shown in FIG. 1A, the bottom conductor 21 has a rectangular shape when the substrate 51 is viewed in the normal direction thereof. The bottom conductor 21 is formed at the same time, in the same layer, and from the same material as the coil conductor 12. For example, the bottom conductor 21 has a thickness e of 8 µm. The bottom conductor 21 is constituted by an underlying conductor 21a made of titanium (Ti) and copper (Cu) formed on the planarized layer 52 of the substrate 51 and a conductor 21b made of Cu and formed on the underlying conductor 21a. The bottom conductor 21 includes an electrode portion serving as an electrode of the capacitor element 11 and a lead-out conductor which is led out to connect the electrode portion and the coil conductor 12. The electrode portion is the square region indicated by a broken line in FIG. 1A which is located substantially in the middle of the bottom conductor 21 and which has a length 1 per side. The lead-out conductor is the rectangular region sandwiched between the electrode portion and the coil conductor 12.

As shown in FIG. 1B, the dielectric film 31 is formed on the coil conductor 12, the bottom conductor 21, and the planarized layer 52 of the substrate 51. The dielectric film 31 is formed substantially throughout the substrate 51 excluding the via opening 31a to substantially cover the entire top and side surfaces of the bottom conductor 21 and the coil conductor 12. For example, the dielectric film 31 has a thickness d of 0.1 µm which is smaller than the thickness e of the bottom conductor 21. For example, alumina, silicon nitride ($Si_4N_3$) or silicon dioxide ($SiO_2$) is used as the material of the dielectric film 31.

As shown in FIG. 1B, the organic insulation film 33 is formed on the dielectric film 31. The organic insulation film 33 is formed from, for example, a photosensitive resin such as photosensitive polyimide. The material of the organic insulation film 33 must have heat-resisting properties. The organic insulation film 33 is formed such that it is separated from the bottom conductor 21 and the coil conductor 12 by the dielectric film 31, and it is therefore not in direct contact with the bottom conductor 21 and the coil conductor 12. The dielectric film 31 is made of a material having a dielectric constant higher than that of the organic insulation film 33. The thickness of the dielectric film 31 is smaller than the thickness of the organic insulation film 33.

Advantages of using an organic material as the material of the organic insulation film 33 will now be described. The organic insulation film 33 preferably has a thickness of several µm or more in order to suppress a parasitic capacity generated between the lead-out conductor of the bottom conductor 21 and the top conductor 23. An insulation film having a thickness of several µm can be formed by applying paste of an inorganic material instead of the organic insulation film 33. However, when an inorganic insulation film is formed by applying such paste, there is a need for a step for baking the inorganic insulation film at a temperature as high as 1000° C. or more. On the contrary, the organic insulation film 33 can be formed at a relatively low temperature compared to an inorganic insulation film. A great amount of time is required for forming an inorganic insulation film having a thickness of several µm using a vapor phase process such as a sputtering process. Therefore, when an inorganic material is used to form the insulation film 33, the cost of the electronic component 1 becomes higher than that in the case of an organic material. Since the organic insulation film 33 has a relatively low dielectric constant compared to an inorganic insulation film, the parasitic capacity between the lead-out conductor and the top conductor 23 can be reduced. The organic insulation film 33 has more advantages than an inorganic insulation film as thus described, and the electronic component 1 can therefore be provided with higher performance by using the organic insulation film 33.

Since the dielectric film 31 is formed to cover the bottom conductor 21 and the coil conductor 12, the organic insulation film 33 is separated from the bottom conductor 21 and the coil conductor 12 by the dielectric film 31. Therefore, the occurrence of electromigration can be prevented even though an organic material is used for the insulation film 33. The dielectric film 31 serves not only as a dielectric film forming a part of the capacitor element 11 but also as a protective film for preventing the occurrence of electromigration.

Unlike the thin film capacitor element disclosed in Patent Document 1, the electronic component 1 includes the organic insulation film 33 having a planar top surface instead of an insulation layer in the form of a protrusion above the substrate surface. Therefore, the electronic component 1 can be easily formed with a greater number of layers. For example, a capacitor element 11 having a great capacity can be provided by forming a multiplicity of the dielectric films 31 one over another. Further, since no insulation layer in the form of a protrusion is formed at the periphery of the capacitor element 11, the inductor element 13 can be formed in the neighborhood of the capacitor element 11. Thus, the electronic component 1 can be provided in a small size.

The organic insulation film 33 is formed with the opening 33b which is located above the dielectric film 31 on the bottom conductor 21. For example, the opening 33b has a square shape when the substrate 51 is viewed in the normal direction thereof, as shown in FIG. 1A. The length 1 of each side of the opening 33b is, for example, 100 µm. The organic insulation film 33 is formed substantially throughout the dielectric film 31 excluding the via openings 33a and 33b.

The top conductor 23 is formed in the opening 33b. The top conductor 23 extends on the organic insulation film 33 from the opening 33b up to a peripheral part of the electronic component 1 on a short side thereof. The top conductor 23 is not formed in the same layer as the bottom conductor 21. As shown in FIG. 1A, the top conductor 23 has a rectangular shape when the substrate surface of the substrate 51 is viewed in the normal direction thereof. For example, the thickness of the top conductor 23 is 8 µm. The top conductor 23 is formed at the same time, in the same layer, and from the same material as the lead-out conductor 61. The top conductor 23 is constituted by the Ti/Cu underlying conductor 23a formed on the dielectric film 31 and the organic insulation film 33 and the Cu conductor 23b formed on the underlying conductor 23a. The top conductor 23 includes the electrode portion formed in the opening 33b to serve as an electrode of the capacitor element 11 and the lead-out conductor formed to extend on the organic insulation film 33 from the opening 33b up to the peripheral part of the electronic component 1 on a short side thereof to connect the electrode portion with an external electrode (not shown) formed on that side of the electronic component 1.

The top conductor 23 extends on the organic insulation film 33 from the opening 33b, and it is not formed in the same layer as the bottom conductor 21. Therefore, no shorting occurs between the bottom conductor 21 and the top conductor 23 even if the dielectric film 31 is formed with a small thickness or not formed at edges of the bottom conductor 21. The breakdown limit value of the withstand voltage and the insulating properties of the electronic component 1 are thus improved, and variation of the quality of the electronic component 1 is suppressed between products thus manufactured.

Since there is no need for providing the dielectric film 31 with a great thickness in order to prevent shorting between the bottom conductor 21 and the top conductor 23, the thickness of the dielectric film 31 can be one-tenth or less of such a thickness according to the related art (2 to 3 μm), which makes it possible to obtain a capacitor element 11 having a great capacity. Since a sufficient capacity can be obtained even if the capacitor element 11 has a small electrode area, the electronic component 1 can be made compact. For example, the length 1 per side of the top conductor 23 formed in the opening 33b may be 50 μm or 30 μm or even smaller, which allows the electronic component 1 to be made compact. Further, since a sufficient capacity can be obtained without providing the dielectric film 31 in a multi-layer structure, the electronic component 1 can be provided with a low profile.

A description will now be made with reference to Table 1 on how the capacity values of the capacitor element 411 according to the related art and the capacitor element 11 of the present embodiment deviate from design values under the influence of deviations of the top conductor forming position, deviations of the forming areas of the top conductor (variations in the shape of the same), variations of the top conductor thickness, and variations of the thickness f of the dielectric films formed on sides of the bottom conductors.

Table 1 shows a comparison between the capacitor element 411 according to the related art and the capacitor element 11 of the present embodiment on results of a simulation and analysis of deviations of the capacity values from the design values under conditions 1 to 10 which are different from each other in terms of the deviation of the top conductor forming position (forming position), the deviation of the top conductor forming area (conductor area), the variation of the top conductor thickness (conductor thickness), and the variation of the thickness f of the dielectric film formed on sides of the bottom conductor (sidewall film thickness).

Figure 19A:
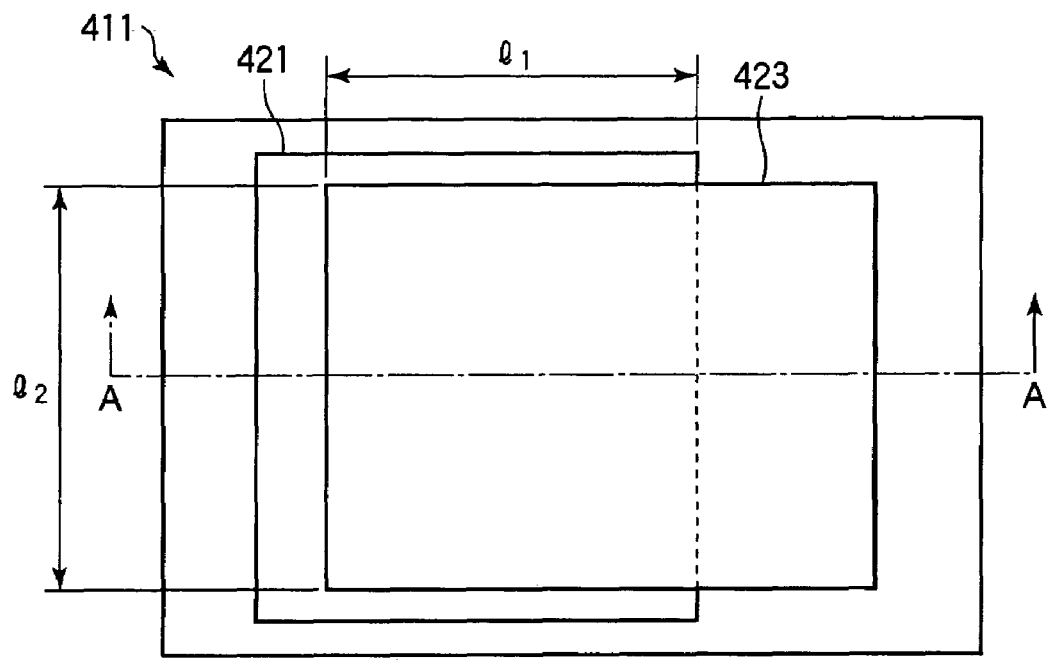
FIGS. 19A and 19B illustrate a capacitor element 411 according to the related art.
Figure 19B:
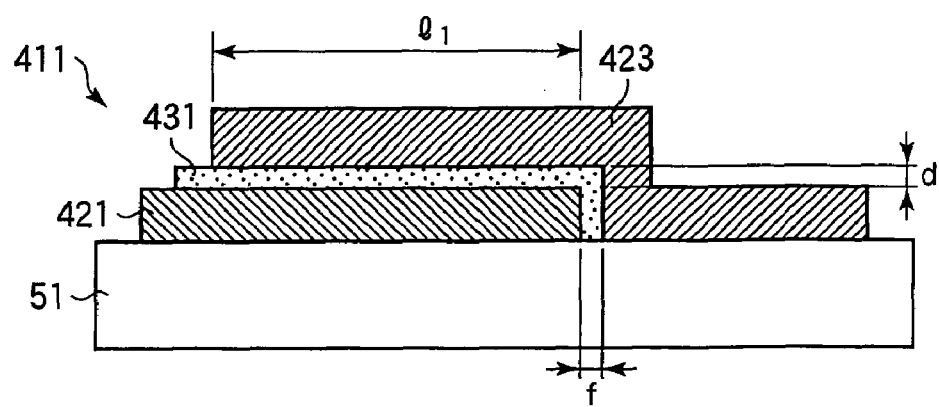

The conditions 1 to 10 are as follows. Referring to FIGS. 1A and 19A, the conditions 1 and 2 are states in which the top conductors are formed in positions deviating by 5 μm from the design values to the left (in the negative (−) direction) or to the right (in the positive (+) direction). The conditions 3 and 4 are states in which the top conductors are formed with areas deviating from the design values as a result of a shortage of −5 μm or excess of +5 μm per side. The condition 5 is a combination of the conditions 1 and 3. The condition 6 is a combination of the conditions 2 and 4. The condition 7 is a combination of the condition 5 and a state in which the top conductor thicknesses deviate from the design values by +1 μm. The condition 8 is a combination of the condition 6 and a state in which the top conductor thicknesses deviate from the design values by −1 μm. The condition 9 is a combination of the condition 7 and a state in which the thicknesses f of the dielectric films formed on the sides of the bottom conductors deviate from the design values by +5%. The condition 10 is a combination of the condition 8 and a state in which the thicknesses f of the dielectric films formed on the sides of the bottom conductors deviate from the design values by −5%.

The design values used for the simulation and analysis were as follows. The lengths 1, 11, and 12 of the sides of the top conductors facing the bottom conductors were 100 μm; the thickness of the top conductors was 8 μm; the dielectric constant of the dielectric films was 7.5; and the thickness d of the dielectric films was 0.1 μm. It was assumed that the bottom conductors were formed according to the design values. The thickness f of the dielectric films formed on the sides of the bottom conductors was 0.1 μm in the capacitor element 411 according to the related art and 5 μm in the capacitor element 11 of the present embodiment. The capacity design value was 7.172 pF or the capacitor element 411 according to the related art and 6.651 pF for the capacitor element 11 of the present embodiment.

TABLE 1

| Condition | Forming Position | Conductor Area | Conductor Thickness | Sidewall Film Thickness | Related Art | Present Embodiment |
|---|---|---|---|---|---|---|
| 1 | −5 μm | 0 | 0 | 0 | 4.6% | 0.0% |
| 2 | +5 μm | 0 | 0 | 0 | −4.6% | 0.0% |
| 3 | 0 | −5 μm | 0 | 0 | −7.2% | −9.7% |
| 4 | 0 | +5 μm | 0 | 0 | 7.4% | 10.2% |
| 5 | −5 μm | −5 μm | 0 | 0 | −11.6% | −9.7% |
| 6 | +5 μm | +5 μm | 0 | 0 | 12.3% | 10.2% |
| 7 | −5 μm | −5 μm | +1 μm | 0 | −10.7% | −9.7% |
| 8 | +5 μm | +5 μm | −1 μm | 0 | 11.3% | 10.2% |
| 9 | −5 μm | −5 μm | +1 μm | +5 μm | −11.1% | −9.7% |
| 10 | +5 μm | +5 μm | −1 μm | −5 μm | 11.7% | 10.2% |

As shown in Table 1, when the top conductor is formed in a position deviating by 5 μm from the design value to the left or right (conditions 1 and 2), the capacity value of the capacitor element 411 according to the related art has a deviation from the design value in the range from −4.6% to 4.6%, whereas the capacity value of the capacitor element 11 of the present embodiment does not deviate from the design value.

When the top conductor is formed with an area deviating from the design value as a result of a shortage of −5 μm or excess of +5 μm per side (conditions 3 and 4), the capacity value of the capacitor element 411 according to the related art has a deviation from the design value in the range from −7.2% to 7.4%, whereas the capacity value of the capacitor element 11 of the present embodiment has a deviation in the range from −9.7% to 10.2%. The capacitor element 11 of the present embodiment has a greater deviation of the capacity value than the capacitor element 411 according to the related art.

When the forming position and area of the top conductor deviate from the respective design values (conditions 5 and 6), the capacity value of the capacitor element 411 according to the related art has a deviation from the design value in the range from −11.6% to 12.3%, whereas the capacity value of the capacitor element 11 of the present embodiment has a deviation in the range from −9.7% to 10.2%. The capacitor element 11 of the present embodiment has a smaller deviation of the capacity value than the capacitor element 411 according to the related art.

When the forming position, area, and thickness of the top conductor deviate from the respective design values (conditions 7 and 8), the capacity value of the capacitor element 411 according to the related art has a deviation from the design value in the range from −10.7% to 11.3%, whereas the capacity value of the capacitor element 11 of the present embodiment has a deviation in the range from −9.7% to 10.2%. The capacitor element 11 of the present embodiment has a smaller deviation of the capacity value than the capacitor element 411 according to the related art. The capacitor value of the capacitor element 11 of the present embodiment does not deviate from the design value even when the thickness of the top conductor 23 deviates from the design value.

When the forming position, area, and thickness of the top conductor and the thickness f of the dielectric film formed on the sides of the bottom conductor deviate from the respective design values (conditions 9 and 10), the capacity value of the capacitor element 411 according to the related art has a deviation from the design value in the range from −11.1% to 11.7%, whereas the capacity value of the capacitor element 11 of the present embodiment has a deviation in the range from −9.7% to 10.2%. The capacitor element 11 of the present embodiment has a smaller deviation of the capacity value than the capacitor element 411 according to the related art. The capacity value of the capacitor element 11 of the present embodiment does not deviate from the design value even when the thickness f of the dielectric film 31 formed on the sides of the bottom conductor 21 deviates from the design value.

Since the electrode area of the capacitor element 11 is determined by the area $1^2$ of the opening 33b as described above, there is no deviation of the capacity value even when the top conductor is formed with a positional deviation. The top conductor 23 is not formed in the same layer as the bottom conductor 21. Since the top conductor 23 and the bottom conductor 21 cannot therefore face each other, it is possible to prevent the generation of a parasitic capacity between the sides of the bottom conductor 21 and the top conductor 23 with the dielectric film 31 on the sides of the bottom conductor 21. As a result, the capacity value does not deviate from the design value even when the thickness of the top conductor 23 and the thickness f of the dielectric film 31 on the sides of the bottom conductor 21 deviate from the design values. Therefore, in the case of the capacitor element 11 of the present embodiment, the deviation of the capacity value can be made about ±2% smaller than that in the capacitor element 411 according to the related art.

Figure 2:
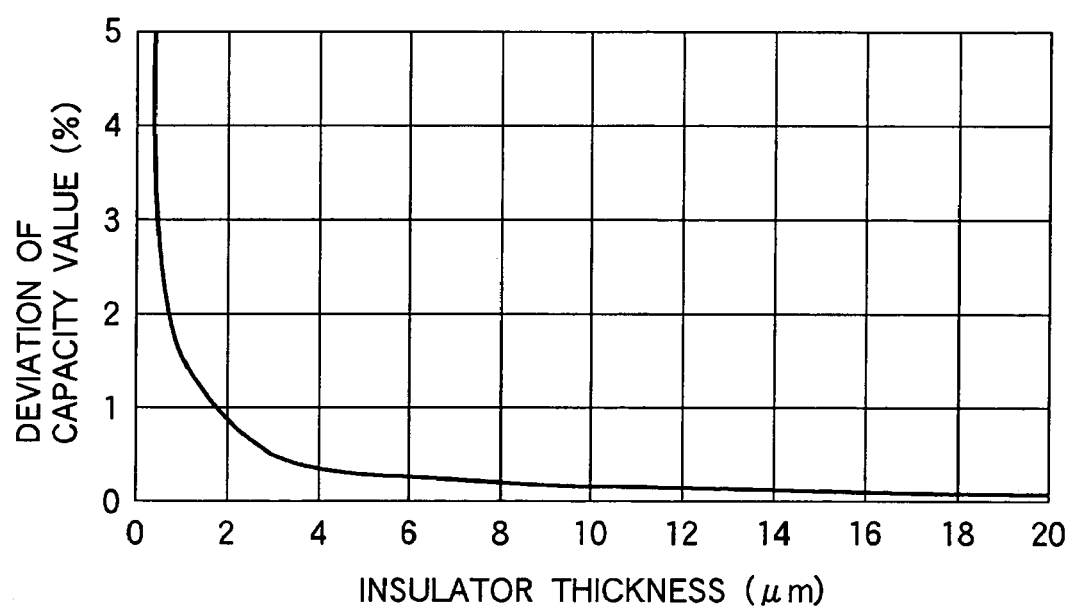
FIG. 2 is a graph showing a relationship between the thickness of an organic insulation film 33 and deviations of the capacity value of a capacitor element 11.

A description will be made with reference to FIG. 2 on a relationship between the thickness of the organic insulation film 33 and deviations of the capacity value of the capacitor element 11 from a design value. FIG. 2 shows results of a simulation and analysis of the relationship between the thickness of the organic insulation film 33 and deviations of the capacity value of the capacitor element 11 from a design value. In FIG. 2, the abscissa axis represents the thickness (μm) of the organic insulation film 33, and the ordinate axis represents deviations of the capacity value of the capacitor element 11 from a design value in percentages (%).

The design values used in the simulation and analysis are as follows. The length 1 of a side of the top conductor 23 facing the bottom conductor 21 is 50 μm, the area of the bottom conductor 21 and the lead-out conductor of the top conductor 23 facing each other is 50×8 μm, the relative dielectric constant of the organic insulation film 33 is 4, and the thickness d of the dielectric film 31 is 0.1 μm. The design value of the capacitance value is 0.886 pF. The bottom conductor 21 and the top conductor 23 are premised to be formed as designed.

Since the capacity value of a capacitor in inversely proportionate to the distance between electrodes thereof in general, a parasitic capacity generated between the bottom conductor 21 and the lead-out conductor of the top conductor 23 is smaller, the greater the thickness of the organic insulation film 33. Therefore, as shown in FIG. 2, the amount of deviation of the capacity value of the capacitor element 11 is substantially inversely proportionate to the thickness of the organic insulation film 33. Incidentally, the thin-film capacitor element disclosed in Patent Document 1 has a structure in which sides of a bottom electrode are disposed opposite to a top electrode with an insulator layer interposed between them. The thickness of the insulation layer is smaller, the smaller the thin-film capacitor element. Thus, the ratio of a parasitic capacity to the capacity value of the thin-film capacitor element increases.

On the contrary, the electronic component 1 of the present embodiment has a structure in which the top conductor 23 is not disposed opposite to the sides of the bottom conductor 21. Thus, a parasitic capacity generated between the sides of the bottom conductor 21 and the top conductor 23 undergoes substantially no change regardless of the size of the electronic component 1. Therefore, there is no increase in the ratio of the parasitic capacity to the capacity value of the capacitor element 11 even when the size of the electronic component 1 is reduced, and the capacity value of the capacitor element 11 is determined by the area $1^2$ of the opening 33b (electrode area) and the thickness d and the dielectric constant of the dielectric film 31 sandwiched between the top conductor 23 and the bottom conductor 21. It is therefore possible to provide an electronic component 1 which is compact and whose capacitor element 11 has an accurate capacity value. An increase in the thickness of the organic insulation film 33 allows the capacitor element 11 to have a more accurate capacity value because capacitive coupling can be suppressed at wirings surrounding the same such as the lead-out conductor.

An increase in the thickness of the organic insulation film 33 allows any parasitic inductance or stray capacity generated between the lead-out conductor of the top conductor 23 and the same of the bottom conductor 21 to be suppressed. The accuracy of the capacity value of the capacitor element 11 can be thus improved. The degradation of transmission characteristics in a high frequency range can be also suppressed. Further, since desired circuit constants can be obtained, the designing of a high frequency circuit is facilitated.

In the case of a thin-film type capacitor element, capacitive coupling of the element and wirings surrounding the same has greater influence on the capacity value, the greater the capacity value achieved by a small facing area. It is advantageous to increase the thickness of the organic insulation film 33 in obtaining a desired capacity value of the capacitor element 11 while reducing the size of the capacitor element 11. Variations of the capacity value between products can be suppressed by reducing variations of the thickness of the organic insulation film 33.

An increase in the thickness of the organic insulation film 33 results in a reduction of any stray capacity between the coil conductor 12 and the lead-out conductor 61, which makes it possible to adapt the self-resonant frequency and antiresonant frequency of the inductor element 13 to high frequencies and to improve the Q-characteristics of the same. For example, the invention allows a reduction of insertion loss, mitigates the suppression of an attenuation of out-of-band characteristics, and improves the steepness of an attenuation band when used in a filter circuit employing an LC resonance circuit which is similar in structure to the capacitor element 11 and the inductor element 13. When it is attempted to reduce the thickness of the capacitor element 11 by reducing the thickness of the organic insulation film 33, the distance between the bottom conductor 21 and the top conductor 23 may be changed in an active way to reduce the thickness of the organic insulation film 33 and the height of the opening 33b, whereby capacitive coupling which occurs between lead-out conductors can be used as the capacity of the capacitor element 11.

An increase in the thickness of the organic insulation film 33 also makes it possible to suppress magnetic coupling and capacitive coupling between the coil conductor 12 and wirings (e.g., the lead-out conductor 61, a ground wiring, a power supply wiring, a shield wiring, and wirings for the inductor element and the capacitor element 11) provided opposite to the wiring of the coil conductor 12.

Electromagnetic coupling and capacitive coupling may be intentionally generated by adjusting the thickness and dielectric constant of the organic insulation film 33 to bring out transmission characteristics at a desired frequency band, whereby the characteristics of the electronic component 1 can be improved. Parasitic components are utilized in an active manner by adjusting the thickness and dielectric constant of the insulating material, whereby magnetic coupling is effectively caused, and AC components are advantageously brought out to suppress DC components. The transmission loss of the electronic component 1 can be thus reduced.

As described above, electromigration can be prevented in the electronic component 1 of the present embodiment because the dielectric film 31 is formed to cover the bottom conductor 21 and the coil conductor 12. The top conductor 23 is not formed in the same layer as the bottom conductor 21, and the sides of the bottom conductor 21 and the sides of the top conductor 23 are not opposite to each other, the generation of a parasitic capacity between the sides of the bottom conductor 21 and the top conductor 23 can be prevented. The accuracy of the capacity value of the capacitor element 11 can be improved by forming an accurate electrode area that is determined by the area $1^2$ of the opening 33b of the organic insulation film 33. Further, the generation of a parasitic capacity between the bottom conductor 21 and the lead-out conductor of the top conductor 23 can be prevented by providing the organic insulation film 33 with a great thickness, whereby the accuracy of the capacity value can be improved.

A method of manufacturing an electronic component 1 according to the present embodiment will now be described with reference to FIGS. 3A to 6B. A multiplicity of electronic components 1 are simultaneously formed on a wafer, and FIGS. 3A to 6B show an element forming region of one of the electronic components 1. FIGS. 3A to 6B are sectional views of the electronic component 1 of the present embodiment showing steps of manufacturing the same.

In the present embodiment, a substrate 51 having a planarized surface is used. First, a surface of the substrate 51 which is formed from alumina ($Al_2O_3$) is polished using a CMP (chemical mechanical polishing) process to form a planarized layer 52.

Figure 3A:
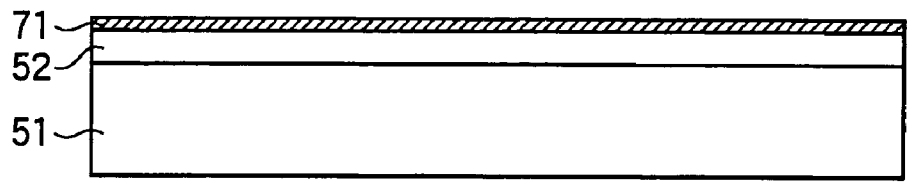
FIGS. 3A, 3B, and 3C are sectional views showing a method of manufacturing the electronic component 1 according to the first embodiment of the invention.
Figure 3B:
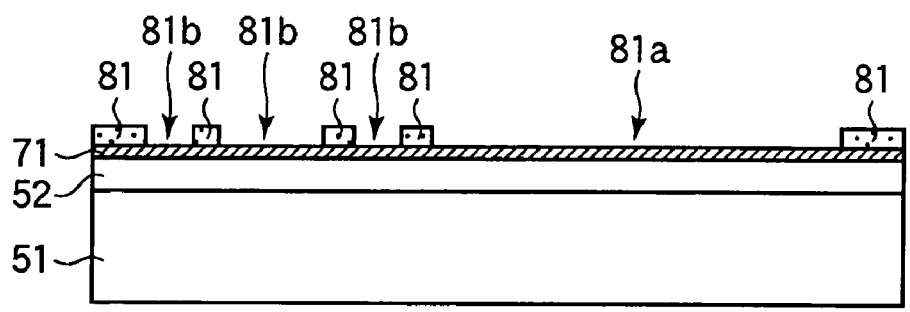

Next, as shown in FIG. 3A, an underlying conductor 71 is formed by stacking a film of titanium (Ti) having a thickness of about 30 nm and a film of copper (Cu) having a thickness of about 100 nm in the order listed on the planarized layer 52 of the substrate 51 using, for example, a sputtering process. Next, a photosensitive resin is applied to the entire surface of the underlying conductor 71 to a thickness of about 8 µm using, for example, a spin coat process to form a photosensitive resin layer 81. Next, as shown in FIG. 3B, the photosensitive resin layer 81 is exposed and developed to form the photosensitive resin layer 81 with an opening 81a and an opening 81b which have a rectangular shape and a spiral shape, respectively, when viewed in the normal direction of the substrate 51. An outer end of the opening 81b is connected to the opening 81a.

Figure 3C:
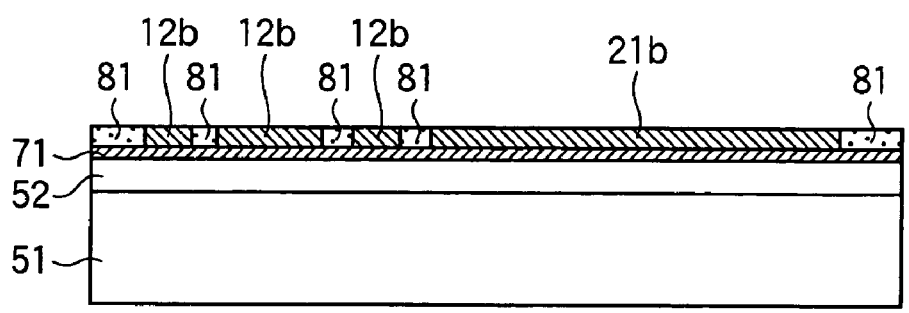
Figure 4A:
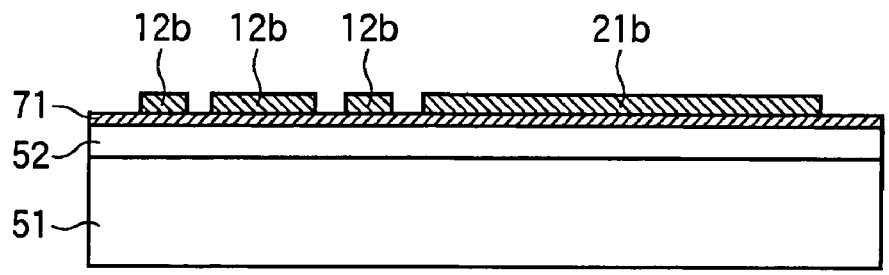
FIGS. 4A, 4B, and 4C are sectional views showing a method of manufacturing the electronic component 1 according to the first embodiment of the invention.

Next, as shown in FIG. 3C, a conductor made of Cu is formed to a thickness of 9 to 10 µm on the underlying conductor 71 in the openings 81a and 81b using an electroplating process. Then, the surface of the conductor is polished using CMP to form conductors 12b and 21b having a thickness of about 8 µm. Next, as shown in FIG. 4A, the photosensitive resin layer 81 is etched and removed.

Figure 4B:
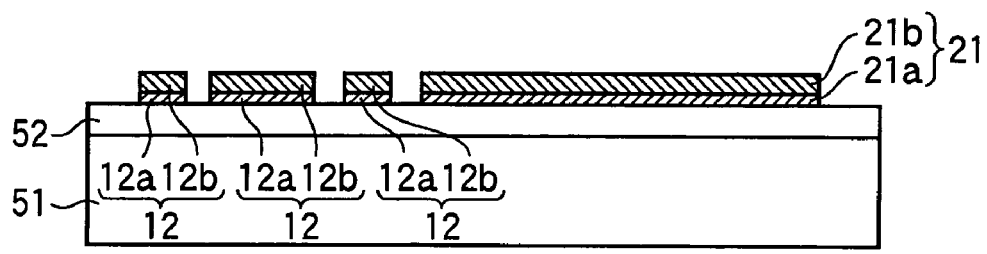

Next, as shown in FIG. 4B, the underlying conductor 71 exposed between the conductors 12b and 21b is removed by performing dry etching or wet etching to form an underlying conductor 21a constituted by the underlying conductor 71 under the conductor 21b and an underlying conductor 12a constituted by the underlying conductor 71 under the conductor 12b. Through the above-described steps, a bottom conductor (first conductor) 21 having a multi-layer structure is formed by stacking the underlying conductor 21a and the conductor 21b, and a coil conductor (third conductor) 12 having a multi-layer structure is formed by stacking the underlying conductor 12a and the conductor 12b.

While a semi-additive process (deposition process) is used to form the bottom conductor 21 and the coil conductor 12 in the present embodiment, the conductors may alternatively be formed using a subtractive process (etching process) or a lift-off process. A top conductor 23 and a lead-out conductor 61, which will be described later, are formed using the same method as for the bottom conductor 21 and the coil conductor 12.

Figure 4C:
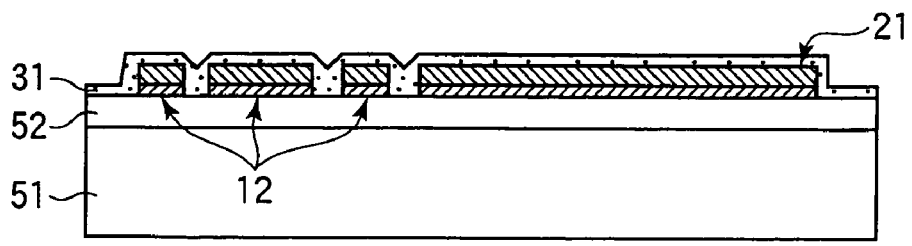

Next, as shown in FIG. 4C, a dielectric film 31 having a thickness of about 0.1 µm is formed throughout the surface. Referring to the material of the dielectric film 31, for example, alumina, silicon nitride ($Si_4N_3$), or silicon dioxide ($SiO_2$) is used. The dielectric film 31 is formed to entirely cover top surfaces and side surfaces of the bottom conductor 21 and the coil conductor 12.

Figure 5A:
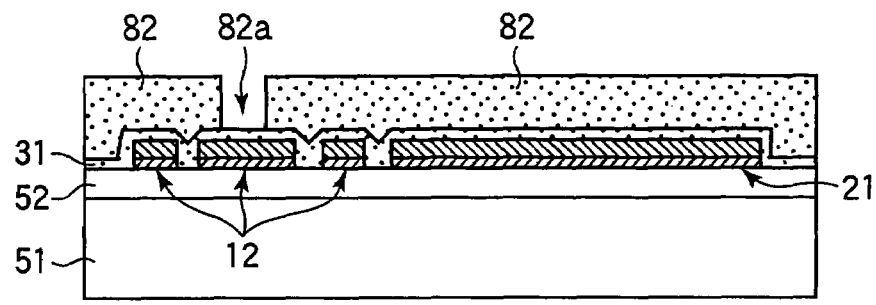
FIGS. 5A, 5B, and 5C are sectional views showing a method of manufacturing the electronic component 1 according to the first embodiment of the invention.

A photosensitive resin is then applied to the entire surface of the dielectric film 31 to form a photosensitive resin layer 82. Next, as shown in FIG. 5A, the photosensitive resin layer 82 is exposed and developed to form an opening 82a in the photosensitive resin layer 82 above an inner end of the coil conductor 12. Post baking (a heating process) is then performed on the photosensitive resin layer 82.

Figure 5B:
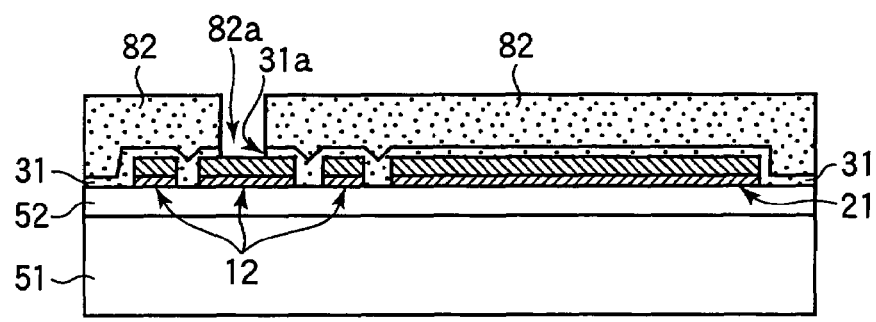
Figure 5C:
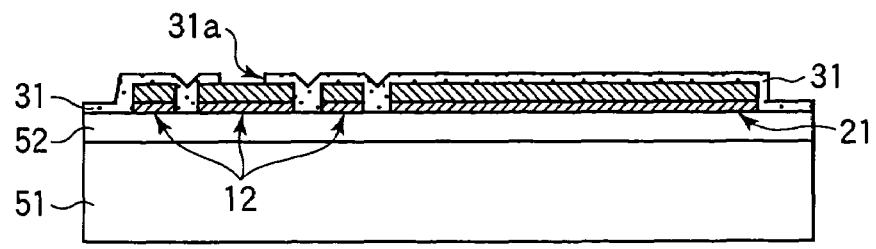

As shown in FIG. 5B, the dielectric film 31 exposed at the opening 82a is then removed by ashing to form the dielectric film 31 with a via opening 31a at which the coil conductor 12 is exposed. As occasion demands, the dielectric film 31 may be simultaneously removed at wafer cutting lines (chip cutting surfaces) which will be described later. When the dielectric film 31 is thus divided into pieces, film stress of the dielectric film 31 can be distributed. Next, as shown in FIG. 5C, the photosensitive resin layer 82 is peeled off.

Figure 6A:
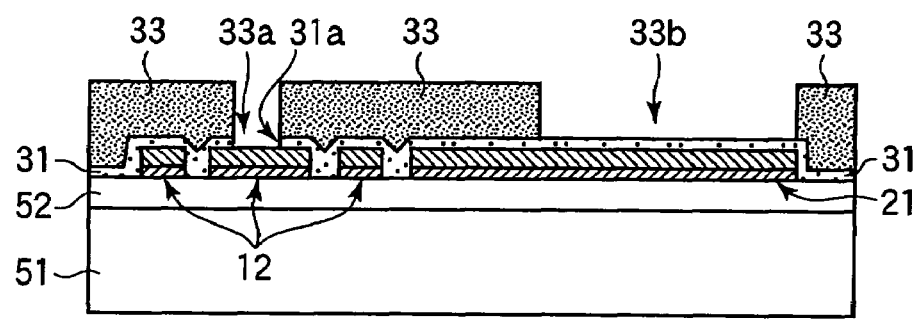
FIGS. 6A and 6B are sectional views showing a method of manufacturing the electronic component 1 according to the first embodiment of the invention.

A photosensitive resin such as polyimide is then applied to the entire surface to form an organic insulation film 33 thereon. Pre-baking is then performed on the organic insulation film 33. Next, as shown in FIG. 6A, the organic insulation film 33 is exposed and developed to form the organic insulation film 33 with a via opening 33a at which the via opening 31a is exposed. At the same time, the organic insulation film 33 is formed with an opening 33b at which part of the dielectric film 31 on the top surface of the bottom conductor 21 is exposed. Post-baking is then performed on the organic insulation film 33.

Figure 6B:
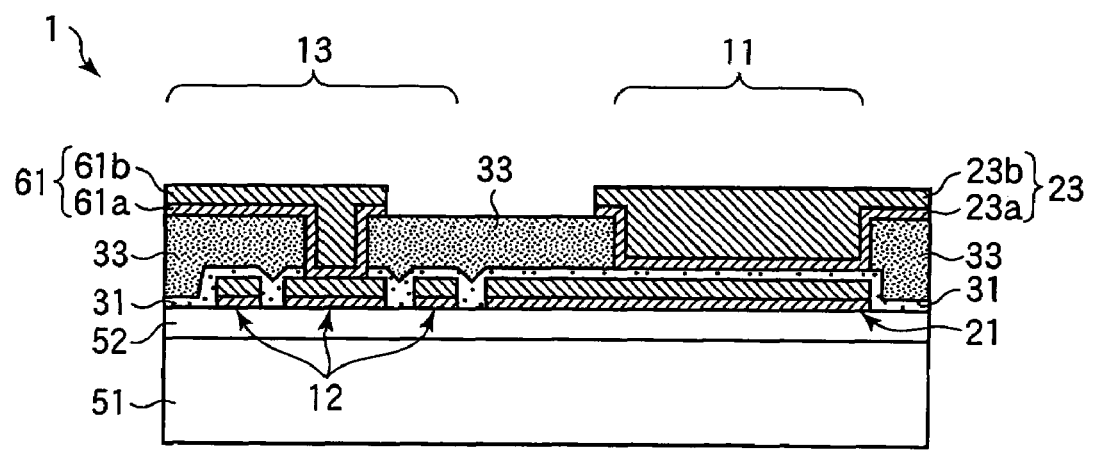

Next, as shown in FIG. 6B, a top conductor 23 and a lead-out conductor 61 are formed using the same method as used for the bottom conductor 21 and the coil conductor 12. More specifically, a film of Ti having a thickness of about 30 nm and a film of Cu having a thickness of about 100 nm are formed throughout the surface in the order listed using, for example, a sputtering process to form an underlying conductor, although not shown. Next, a photosensitive resin is applied to the entire surface of the underlying conductor to a thickness of about 8 µm using, for example, a spin coat process to form a photosensitive resin layer thereon.

The photosensitive resin layer is then exposed and developed to form openings identical in shape to the top conductor 23 and the lead-out conductor 61 in the photosensitive resin layer.

A conductor made of Cu having a thickness in the range from 9 to 10 μm is then formed on the underlying conductor exposed at the openings using an electroplating process. The surface of the conductor is then polished using CMP to form a conductor 23b and a conductor 61b having a thickness of about 8 μm. Next, the photosensitive resin layer is etched away.

Next, as shown in FIG. 6B, dry etching or wet etching is performed to remove the underlying conductor exposed around the conductors 23b and 61b and between the conductors 23b and 61b, thereby forming an underlying conductor 23a constituted by the underlying conductor under the conductor 23b and an underlying conductor 61a constituted by the underlying conductor under the conductor 61b. Thus, a top conductor (second conductor) 23 having a multi-layer structure is formed by stacking the underlying conductor 23a and the conductor 23b, and a lead-out conductor 61 having a multi-layer structure is formed by stacking the underlying conductor 61a and the conductor 61b.

Through the above-described steps, a capacitor element (capacity) 11 constituted by the bottom conductor 21, the dielectric film 31, and the top conductor 23 is formed. At the same time, an inductor element (circuit element) 13 constituted by the coil conductor 12 and the lead-out conductor 61 is formed. A protective film is then formed throughout the surface as occasion demands.

Next, the wafer is cut along predetermined cutting lines to divide a plurality of the electronic components 1 formed on the wafer into each element forming region in the form of a chip. Although not shown, an external electrode electrically connected to each of the top conductor 23 and the lead-out conductor 61 exposed on a cut surface is then formed on the cut surface. Then, corners of each chip are chamfered as occasion demands to complete an electronic component 1.

According to the method of manufacturing the electronic component 1 of the present embodiment, since the dielectric film 31 is formed to cover the entire top surfaces and side surfaces of the bottom conductor 21 and the coil conductor 12 to serve as a protective film for them, electromigration will not occur even when an organic material is used for the insulation film. Therefore, it is not required to provide a step for forming a conductor made of Ni or Ti on the bottom conductor 21 and the coil conductor 12. The bottom conductor 21 of the capacitor element 11 and the coil conductor 12 are simultaneously formed at the same step, and the top conductor 23 and the lead-out conductor 61 are simultaneously formed at the same step. Therefore, a reduction in the number of manufacturing steps can be achieved, and the electronic component 1 can be manufactured at a low cost. Since the insulation properties of the organic insulation film 33 can be maintained, the electronic component 1 can be manufactured with improved yield to provide the electronic component 1 at a low cost.

Electronic components according to modifications of the present embodiment will now be described with reference to FIGS. 7A to 10B. In the following description, elements having the same functions and operations as those in the first embodiment are indicated by like reference numerals and will not be described in detail.

(Modification 1)

Figure 7A:
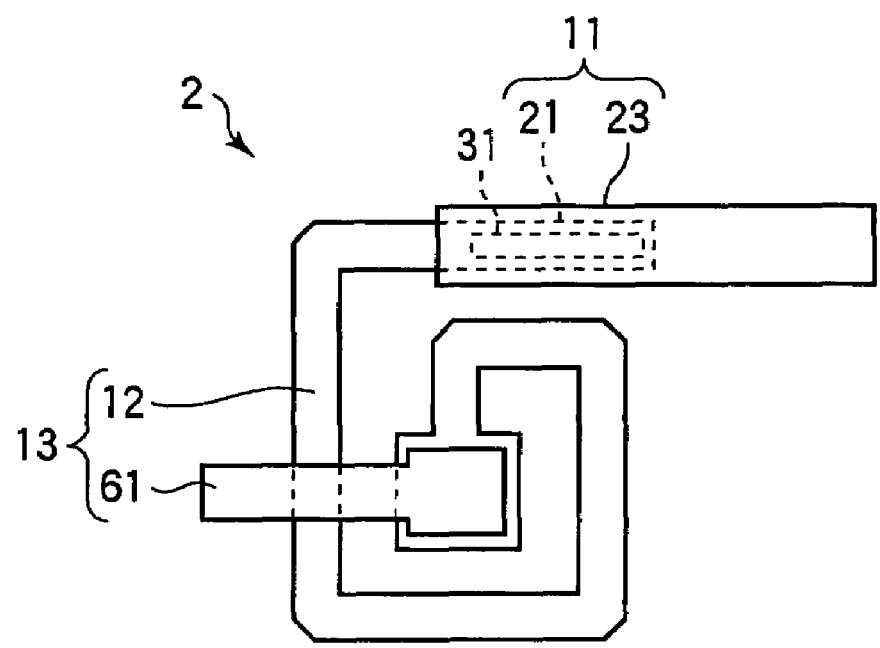
FIGS. 7A and 7B illustrate a modification of the electronic component 1 according to the first embodiment of the invention.
Figure 7B:
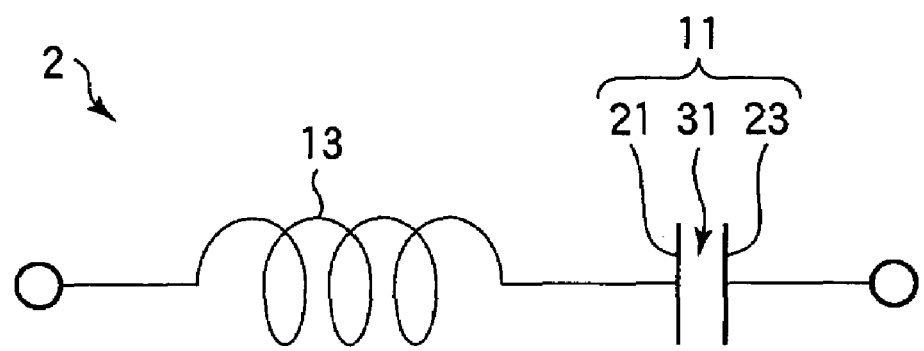

An electronic component 2 according to Modification 1 of the present embodiment will be first described with reference to FIGS. 7A and 7B. FIG. 7A is a plan view of the electronic component 2 of the present modification showing only conductors and a dielectric film 31 constituting a capacitor element 11. FIG. 7B shows an equivalent circuit of the electronic component 2. As shown in FIG. 7A, in the electronic component 2, a part of a coil conductor 12 having a spiral shape which is located at an outer end of the conductor serves as a bottom conductor 21 of a capacitor element 11. As shown in FIG. 7B, the capacitor element 11 and an inductor element 13 are connected in series to form a series resonance circuit. Each of a lead-out conductor 61 and a top conductor 23 serves as a terminal for energization.

(Modification 2)

Figure 8A:
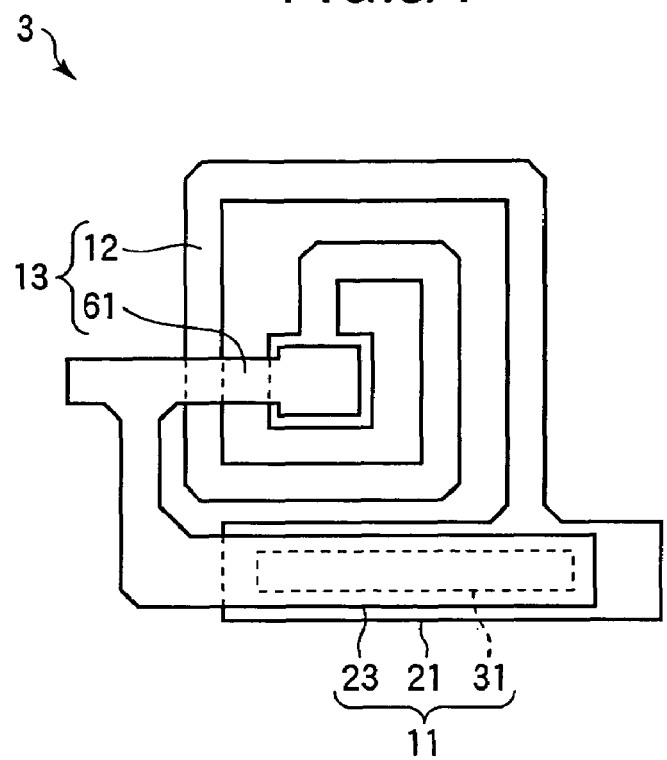
FIGS. 8A and 8B illustrate another modification of the electronic component 1 according to the first embodiment of the invention.
Figure 8B:
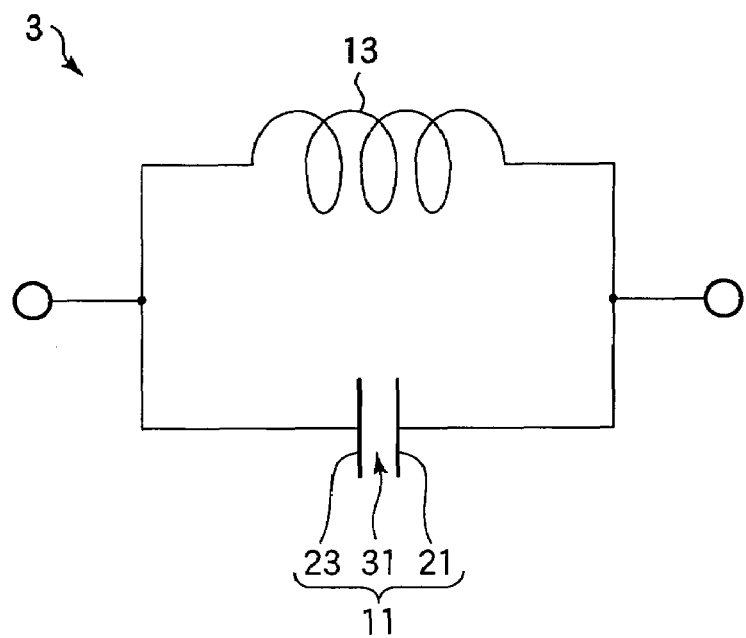

An electronic component 3 according to Modification 2 of the present embodiment will be described with reference to FIGS. 8A and 8B. FIG. 8A is a plan view of the electronic component 3 of the present modification showing only conductors and a dielectric film 31 constituting a capacitor element 11. FIG. 8B is an equivalent circuit diagram of the electronic component 3. As shown in FIG. 8A, an inductor element 13 includes a coil conductor 12 having a spiral shape and a rectangular lead-out conductor 61 connected to an inner end of the coil conductor 12 and extending in the horizontal direction of the figure. The capacitor element 11 includes a rectangular bottom conductor 21 formed integrally with the coil conductor 12, connected to an outer end of the coil conductor 12, and extending in the horizontal direction of the figure and an L-shaped top conductor 23 formed integrally with the lead-out conductor 61 and provided to face the bottom conductor 21. As shown in FIG. 8B, the capacitor element 11 and the inductor element 13 are connected in parallel to form a parallel resonance circuit. The top conductor 23 is electrically connected to the lead-out conductor 61. Each of the lead-out conductor 61 and the bottom conductor 21 serves as a terminal for energization.

(Modification 3)

Figure 9A:
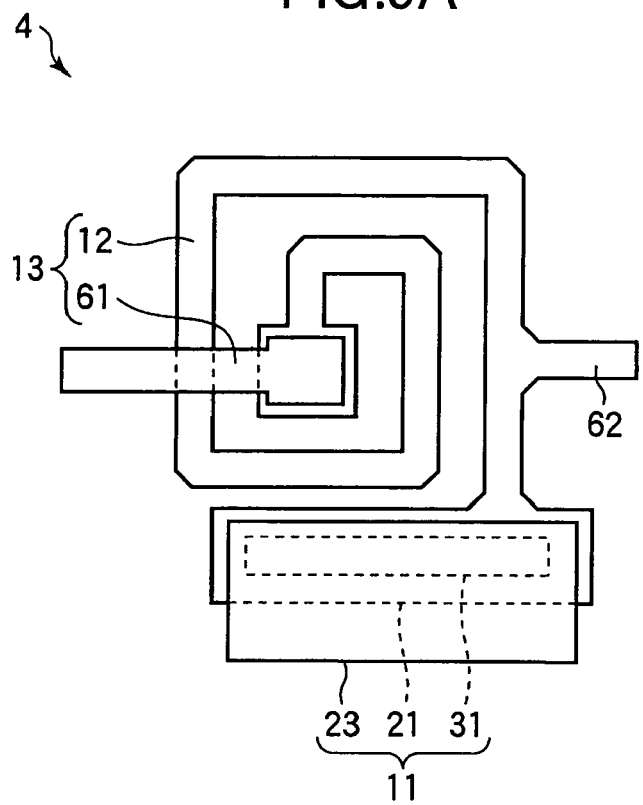
FIGS. 9A and 9B illustrate another modification of the electronic component 1 according to the first embodiment of the invention.
Figure 9B:
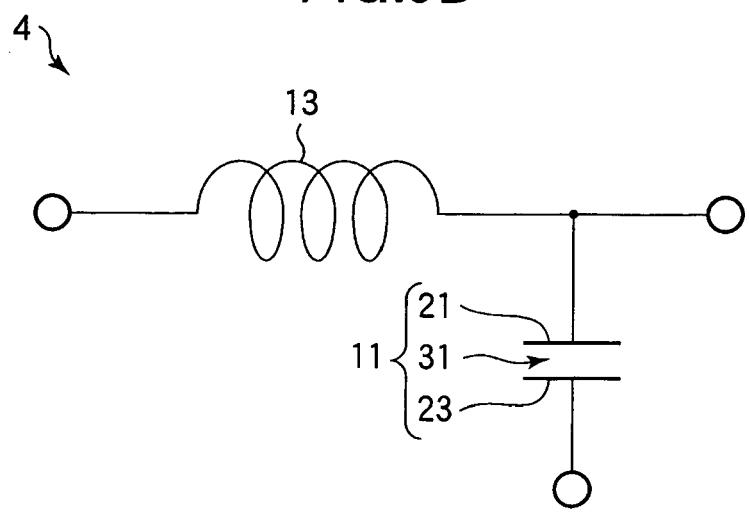

An electronic component 4 according to Modification 3 of the present embodiment will be described with reference to FIGS. 9A and 9B. FIG. 9A is a plan view of the electronic component 4 of the present modification showing only conductors and a dielectric film 31 constituting a capacitor element 11. FIG. 9B is an equivalent circuit diagram of the electronic component 4. As shown in FIG. 9A, an inductor element 13 includes a coil conductor 12 having a spiral shape and a rectangular lead-out conductor 61 connected to an inner end of the coil conductor 12 and extending in the horizontal direction of the figure. The capacitor element 11 includes a rectangular bottom conductor 21 formed integrally with the coil conductor 12, connected to an outer end of the coil conductor 12, and extending in the horizontal direction of the figure and a rectangular top conductor 23 provided above the bottom conductor 21 so as to face the same. As shown in FIG. 9B, the inductor element 13 and the capacitor element 11 form a low-pass filter. The lead-out conductor 61 serves as a terminal on an input side the same. Another lead-out conductor 62 led out in the neighborhood of the outer end of the coil conductor 12 serves as a terminal on an output side of the same. The top conductor 23 serves as a terminal for grounding.

(Modification 4)

Figure 10A:
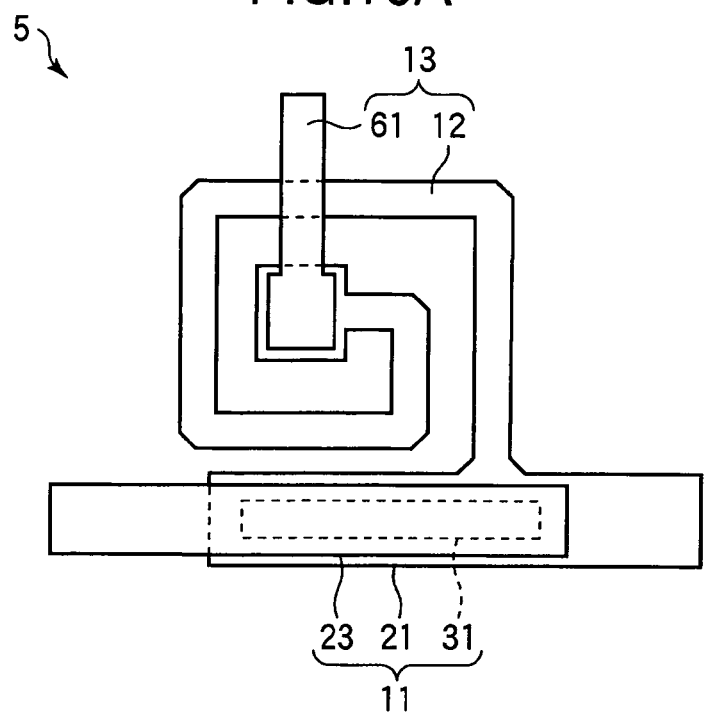
FIGS. 10A and 10B illustrate another modification of the electronic component 1 according to the first embodiment of the invention.
Figure 10B:
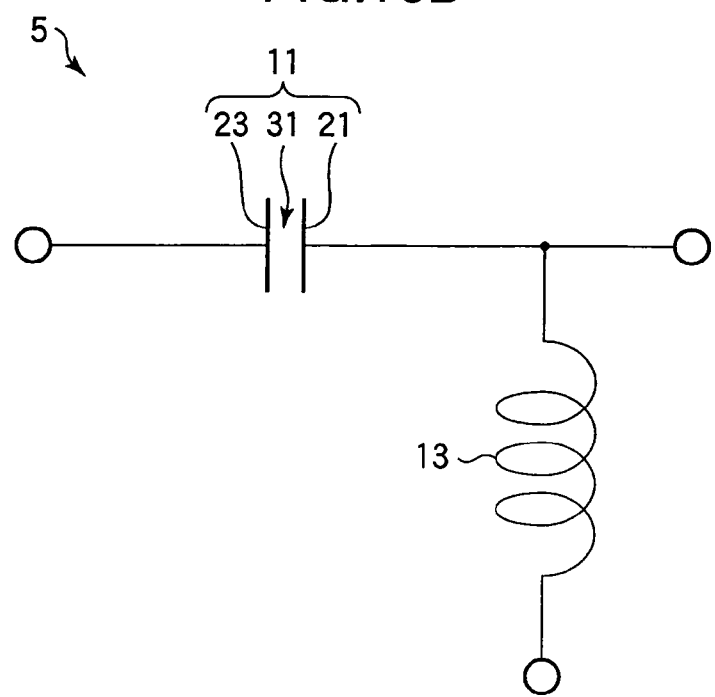

An electronic component 5 according to Modification 4 of the present embodiment will be described with reference to FIGS. 10A and 10B. FIG. 10A is a plan view of the electronic component 5 of the present modification showing only conductors and a dielectric film 31 constituting a capacitor element 11. FIG. 10B is an equivalent circuit diagram of the electronic component 5. As shown in FIG. 10A, an inductor element 13 includes a coil conductor 12 having a spiral shape and a rectangular lead-out conductor 61 connected to an inner end of the coil conductor 12 and extending in the vertical direction of the figure. The capacitor element 11 includes a rectangular bottom conductor 21 formed integrally with the coil conductor 12, connected to an outer end of the coil conductor 12, and extending in the horizontal direction of the figure and a rectangular top conductor 23 provided above the bottom conductor 21 so as to face the same. As shown in FIG. 10B, the inductor element 13 and the capacitor element 11 form a high-pass filter. The top conductor 23 serves as a terminal on an input side the same. The bottom conductor 21 serves as a terminal on an output side of the same. The lead-out conductor 61 serves as a terminal for grounding.

Second Embodiment

Figure 11:
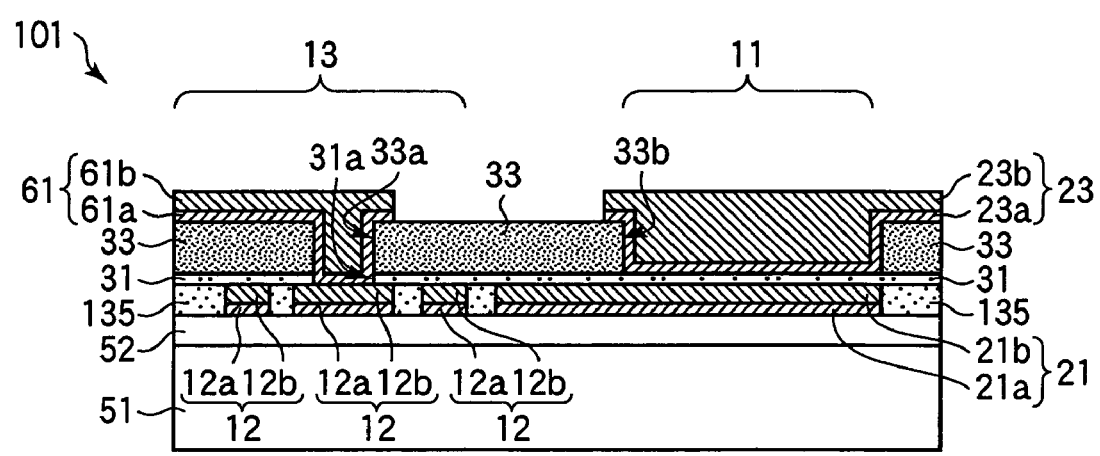
FIG. 11 is a sectional view of an electronic component 101 according to a second embodiment of the invention.

An electronic component according to a second embodiment of the invention will now be described with reference to FIGS. 11 to 16B. First, an electronic component 101 according to the present embodiment will be described with reference to FIG. 11. FIG. 11 is a sectional view of the electronic component 101 of the present embodiment.

The electronic component 101 of the present embodiment is characterized in that a dielectric film 31 is planar substantially throughout a substrate surface of a substrate 51. An insulation film 135 is formed around a bottom conductor 21 and a coil conductor 12 and at a gap between the conductors. The insulation film 135 is formed from a photosensitive resin such as photosensitive polyimide. The thickness of the insulation film 135 is substantially equal to the thickness of the bottom conductor 21 and the coil conductor 12, and top surfaces of the bottom conductor 21, the coil conductor 12, and the insulation film 135 are smoothly formed. The dielectric film 31 is flatly formed on substantially throughout the bottom conductor 21, the coil conductor 12, and the insulation film 135. The configuration of the electronic component 101 will not be further described because it is similar to that of the electronic component 1 except that the bottom conductor 21, the coil conductor 12, and the insulation film 135 are formed to have a smooth top surface and that the dielectric film 31 is planar substantially throughout the substrate surface of the substrate 51.

In the electronic component 101 of the present embodiment, the insulation film 135 is formed in the same layer as the bottom conductor 21 and the coil conductor 12 and formed with a planar top surface. The dielectric film 31 is formed on the planar surface. Therefore, even when the thickness of the dielectric film 31 is small, the thickness of the dielectric film 31 can be kept uniform even at edges of the bottom conductor 21 to provide insulation between the top conductor 23 and the bottom conductor 21. Thus, an improvement over the electronic component 101 can be achieved in terms of the breakdown limit value of the withstand voltage. Further, the dielectric film 31 is formed to cover the bottom conductor 21 and the coil conductor 12, and an electrode area of a capacitor element 11 is determined by the area of an opening 33b of an organic insulation film 33. Therefore, the same advantage as that of the electronic component 1 of the first embodiment can be achieved.

A method of manufacturing an electronic component 101 according to the present embodiment will now be described with reference to FIGS. 12A to 16B. A multiplicity of electronic components 101 are simultaneously formed on a wafer, and FIGS. 12A to 16B show an element forming region of one of the electronic components 101. FIGS. 12A to 16B are sectional views of the electronic component 101 of the present embodiment showing steps of manufacturing the same.

In the present embodiment, a substrate 51 having a planarized surface is used. First, a surface of the substrate 51 which is formed from alumina ($Al_2O_3$) is polished using a CMP (chemical mechanical polishing) process to form a planarized layer 52.

Figure 12A:
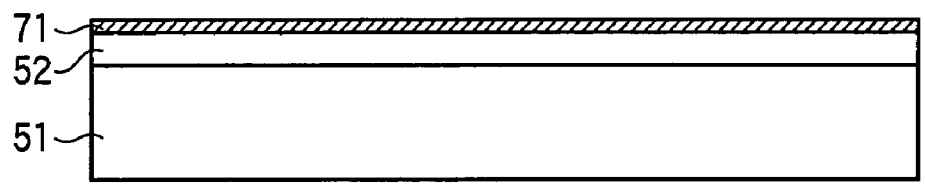
FIGS. 12A, 12B, and 12C are sectional views showing a method of manufacturing the electronic component 101 according to the second embodiment of the invention.
Figure 12B:
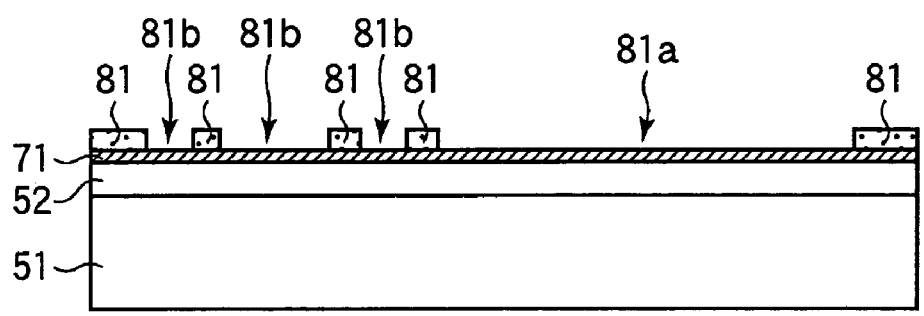

Next, as shown in FIG. 12A, an underlying conductor 71 is formed by stacking a film of titanium (Ti) having a thickness of about 30 nm and a film of copper (Cu) having a thickness of about 100 nm in the order listed on the planarized layer 52 of the substrate 51 using, for example, a sputtering process. Next, a photosensitive resin is applied to the entire surface of the underlying conductor 71 to a thickness of about 8 μm using, for example, a spin coat process to form a photosensitive resin layer 81. Next, as shown in FIG. 12B, the photosensitive resin layer 81 is exposed and developed to form the photosensitive resin layer 81 with an opening 81a and an opening 81b which have a rectangular shape and a spiral shape, respectively, when viewed in the normal direction of the substrate 51. An outer end of the opening 81b is connected to the opening 81a.

Figure 12C:
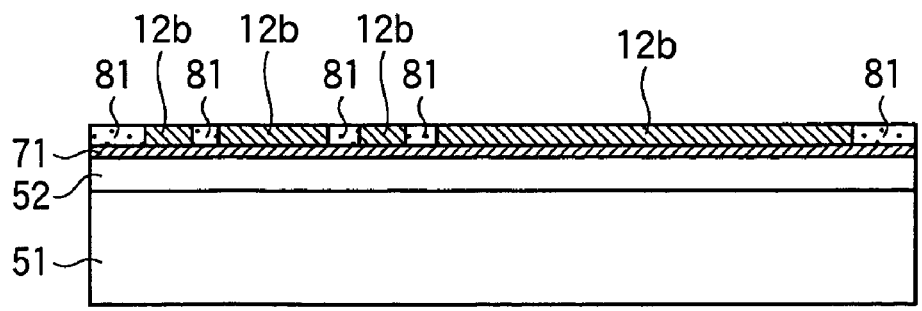
Figure 13A:
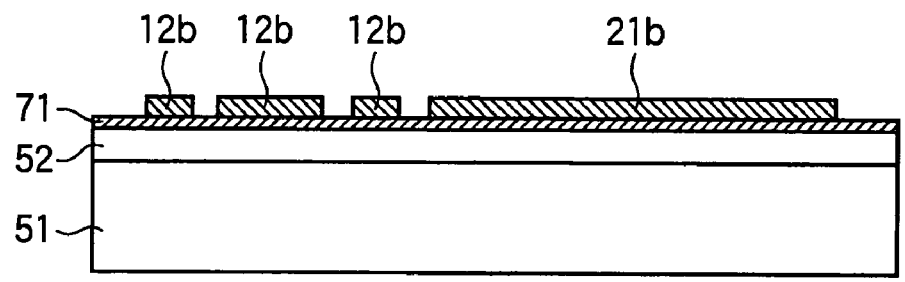
FIGS. 13A, 13B, and 13C are sectional views showing the method of manufacturing the electronic component 101 according to the second embodiment of the invention.

Next, as shown in FIG. 12C, a conductor made of Cu is formed to a thickness of 9 to 10 m on the underlying conductor 71 in the openings 81a and 81b using an electroplating process to provide conductors 12b and 21b. Then, the photosensitive resin layer 81 is peeled off as shown in FIG. 13A.

Figure 13B:
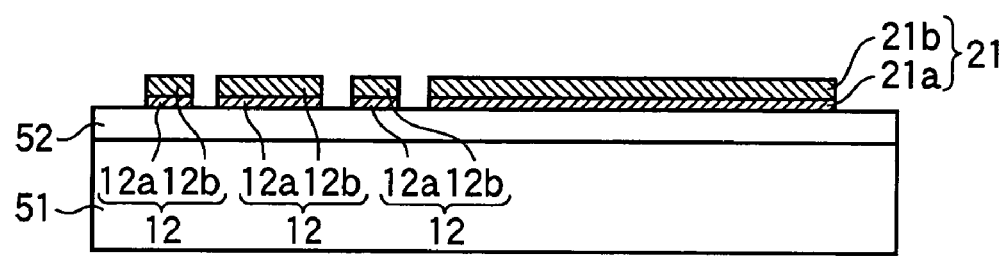

Next, as shown in FIG. 13B, the underlying conductor 71 exposed between the conductors 12b and 21b is removed by performing dry etching or wet etching to form an underlying conductor 21a constituted by the underlying conductor 71 under the conductor 21b and an underlying conductor 12a constituted by the underlying conductor 71 under the conductor 12b. Through the above-described steps, a bottom conductor (first conductor) 21 having a multi-layer structure is formed by stacking the underlying conductor 21a and the conductor 21b, and a coil conductor (third conductor) 12 having a multi-layer structure is formed by stacking the underlying conductor 12a and the conductor 12b.

While a semi-additive process (deposition process) is used to form the bottom conductor 21 and the coil conductor 12 in the present embodiment, the conductors may alternatively be formed using a subtractive process (etching process) or a lift-off process. A top conductor 23 and a lead-out conductor 61, which will be described later, are formed using the same method as for the bottom conductor 21 and the coil conductor 12.

Figure 13C:
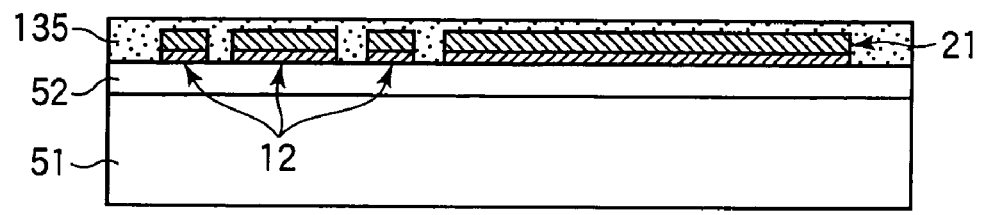
Figure 14A:
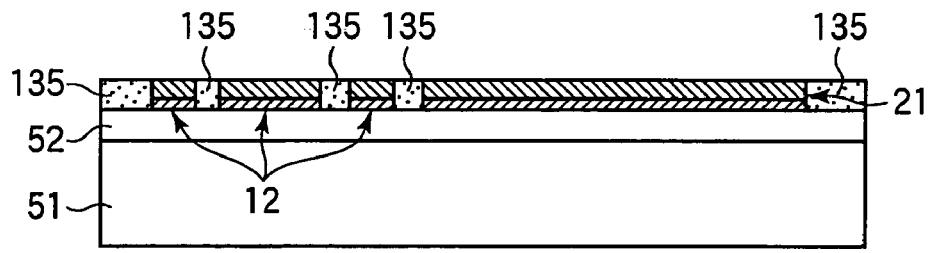
FIGS. 14A, 14B, and 14C are sectional views showing the method of manufacturing the electronic component 101 according to the second embodiment of the invention.

Next, as shown in FIG. 13C, a photosensitive resin such as polyimide is applied to the entire surface to form an insulation film 135. Post-baking is then performed on the insulation film 135. Next, as shown in FIG. 14A, the top surface of the insulation film 135 is polished using a CMP process until top surfaces of the bottom conductor 21 and the coil conductor 12 are exposed. The bottom conductor 21, the coil conductor 12, and the insulation film 135 are formed with a thickness of about 8 μm. Thus, the top surfaces of the bottom conductor 21, the coil conductor 12, and the insulation film 135 are planarized.

Figure 14B:
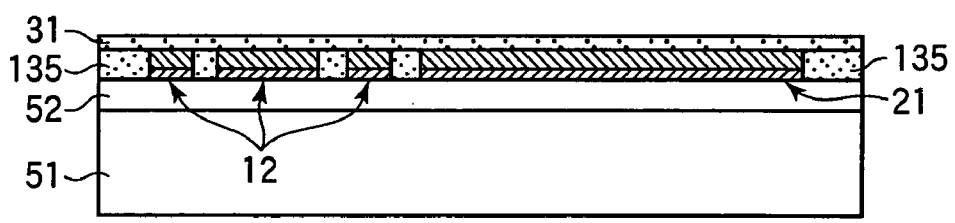

Next, as shown in FIG. 14B, a dielectric film 31 having a thickness of about 0.1 μm is formed throughout the surface. Referring to the material of the dielectric film 31, for example, alumina, silicon nitride ($Si_4N_3$), or silicon dioxide ($SiO_2$) is used. Since the top surfaces of the bottom conductor 21, the coil conductor 12, and the insulation film 135 are planar, the dielectric film 31 is flatly formed to entirely cover the top surfaces of the bottom conductor 21, the coil conductor 12, and the insulation film 135.

Figure 14C:
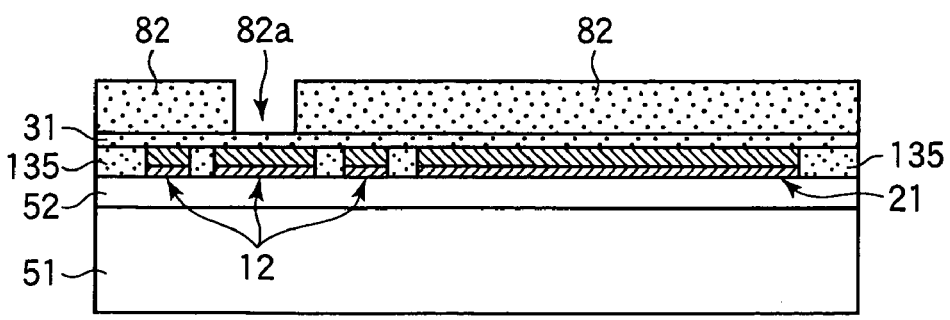

A photosensitive resin is then applied to the entire surface of the dielectric film 31 to form a photosensitive layer 82. Next, as shown in FIG. 14C, the photosensitive resin layer 82 is exposed and developed to form an opening 82a in the photosensitive resin layer 82 above an inner end of the coil conductor 12. Post baking (a heating process) is then performed on the photosensitive resin layer 82.

Figure 15A:
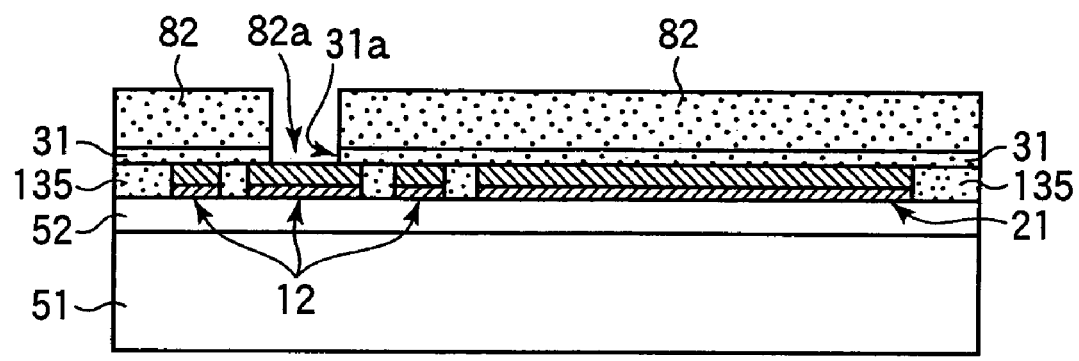
FIGS. 15A and 15B are sectional views showing the method of manufacturing the electronic component 101 according to the second embodiment of the invention.
Figure 15B:
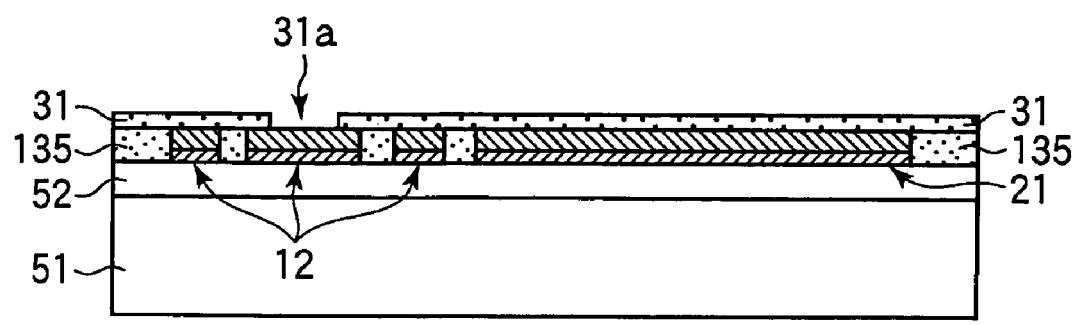

As shown in FIG. 15A, the dielectric film 31 exposed at the opening 82a is then removed by ashing to form the dielectric film 31 with a via opening 31a at which the coil conductor 12 is exposed. As occasion demands, the dielectric film 31 may be simultaneously removed at wafer cutting lines (chip cutting surfaces) which will be described later. When the dielectric film 31 is thus divided into pieces, film stress of the dielectric film 31 can be distributed. Next, the photosensitive resin layer 82 is peeled off as shown in FIG. 15B.

Figure 16A:
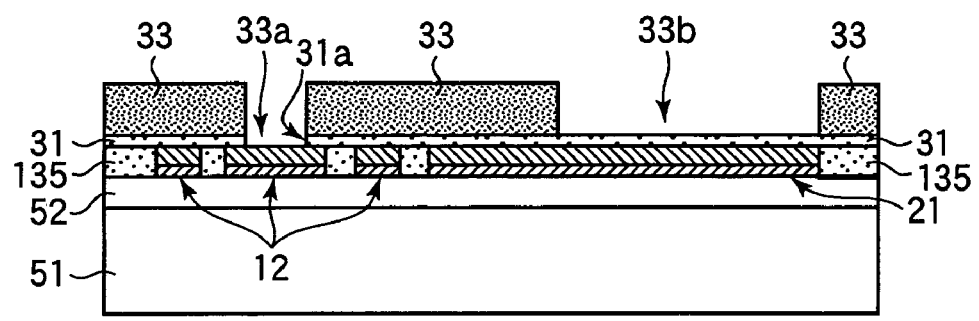
FIGS. 16A and 16B are sectional views showing the method of manufacturing the electronic component 101 according to the second embodiment of the invention.

A photosensitive resin such as polyimide is then applied to the entire surface to form an organic insulation film 33 thereon. Pre-baking is then performed on the organic insulation film 33. Next, as shown in FIG. 16A, the organic insulation film 33 is exposed and developed to form the organic insulation film 33 with a via opening 33a at which the via opening 31a is exposed. At the same time, the organic insulation film 33 is formed with an opening 33b at which part of the dielectric film 31 on the top surface of the bottom conductor 21 is exposed. Post-baking is then performed on the organic insulation film 33.

Figure 16B:
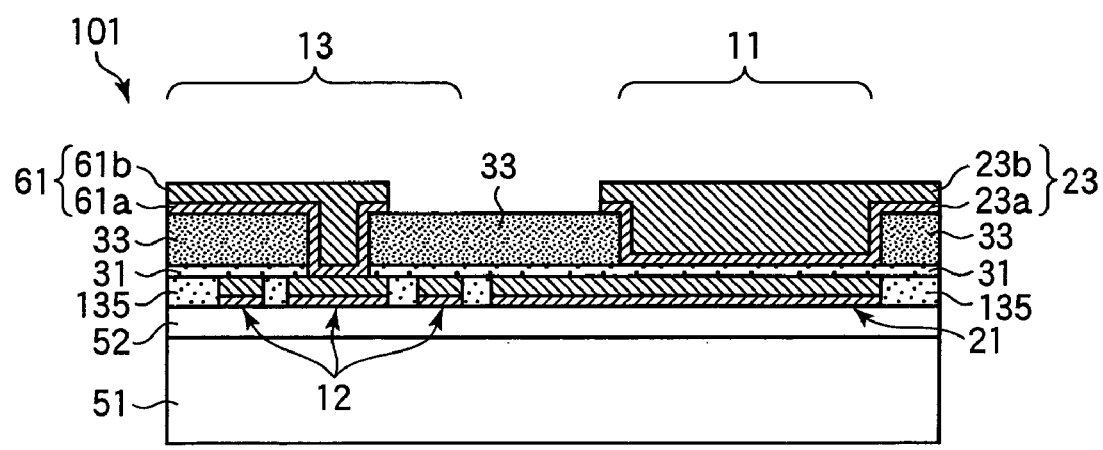

Next, as shown in FIG. 16B, a top conductor 23 and a lead-out conductor 61 are formed using the same method as used for the bottom conductor 21 and the coil conductor 12. More specifically, a film of Ti having a thickness of about 30 nm and a film of Cu having a thickness of about 100 nm are formed throughout the surface in the order listed using, for example, a sputtering process to form an underlying conductor, although not shown. Next, a photosensitive resin is applied to the entire surface of the underlying conductor to a thickness of about 8 μm using, for example, a spin coat process to form a photosensitive resin layer thereon.

The photosensitive resin layer is then exposed and developed to form openings identical in shape to the top conductor 23 and the lead-out conductor 61 in the photosensitive resin layer.

A conductor made of Cu having a thickness in the range from 9 to 10 μm is then formed on the underlying conductor exposed at the openings using an electroplating process. The surface of the conductor is then polished using CMP to form a conductor 23b and a conductor 61b having a thickness of about 8 μm. Next, the photosensitive resin layer is peeled off.

Next, as shown in FIG. 16B, dry etching or wet etching is performed to remove the underlying conductor exposed around the conductors 23b and 61b and between the conductors 23b and 61b, thereby forming an underlying conductor 23a constituted by the underlying conductor under the conductor 23b and an underlying conductor 61a constituted by the underlying conductor under the conductor 61b. Thus, a top conductor (second conductor) 23 having a multi-layer structure is formed by stacking the underlying conductor 23a and the conductor 23b, and a lead-out conductor 61 having a multi-layer structure is formed by stacking the underlying conductor 61a and the conductor 61b.

Through the above-described steps, a capacitor element (capacity) 11 constituted by the bottom conductor 21, the dielectric film 31, and the top conductor 23 is formed. At the same time, an inductor element (circuit element) 13 constituted by the coil conductor 12 and the lead-out conductor 61 is formed. A protective film is then formed throughout the surface as occasion demands.

Next, the wafer is cut along predetermined cutting lines to divide a plurality of the electronic components 101 formed on the wafer into each element forming region in the form of a chip. Although not shown, an external electrode electrically connected to each of the top conductor 23 and the lead-out conductor 61 exposed on a cut surface is then formed on the cut surface. Then, corners of each chip are chamfered as occasion demands to complete an electronic component 101.

According to the method of manufacturing the electronic component 101 of the present embodiment, since the dielectric film 31 is formed to cover the entire top surfaces of the bottom conductor 21 and the coil conductor 12 to serve as a protective film for them, electromigration will not occur even when an organic material is used for the insulation film. Therefore, it is not required to provide a step for forming a conductor made of Ni or Ti on the bottom conductor 21 and the coil conductor 12. The bottom conductor 21 of the capacitor element 11 and the coil conductor 12 are simultaneously formed at the same step, and the top conductor 23 and the lead-out conductor 61 are simultaneously formed at the same step. Therefore, a reduction in the number of manufacturing steps can be achieved, and the electronic component 101 can be manufactured at a low cost. Since the insulation properties of the organic insulation film 33 can be maintained, the electronic component 101 can be manufactured with improved yield to provide the electronic component 101 at a low cost.

Third Embodiment

Figure 17:
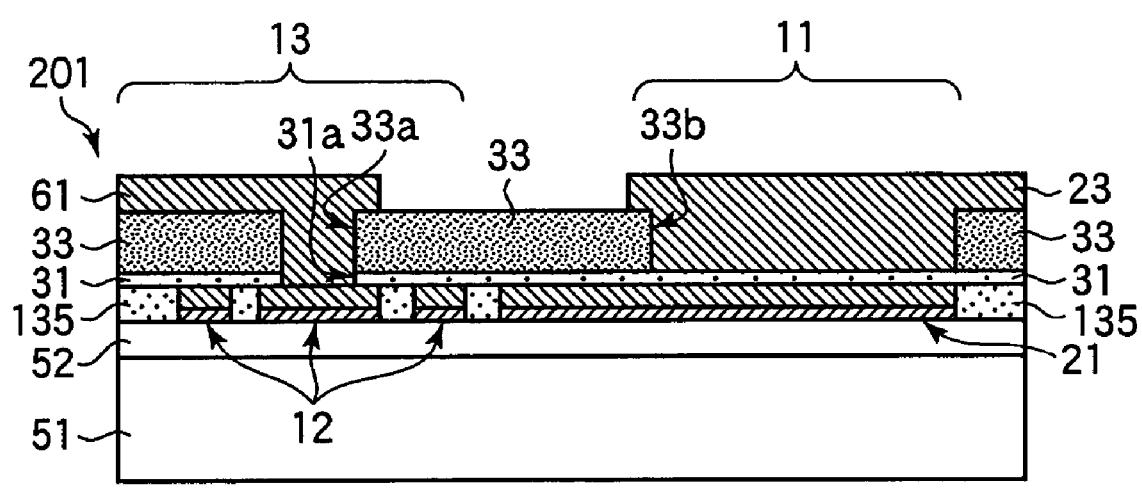
FIG. 17 is a sectional view of an electronic component 201 according to a third embodiment of the invention.

An electronic component according to a third embodiment of the invention will now be described with reference to FIG. 17. FIG. 17 is a sectional view of an electronic component 201 of the present embodiment.

The electronic component 201 of the present embodiment is characterized in that a bottom conductor 21, a coil conductor 21, a top conductor 23, and a lead-out conductor 61 are formed using a pasting process. The bottom conductor 21, the coil conductor 12, the top conductor 23, and the lead-out conductor 61 are formed as a single layer constituted from a conductive resin or conductive paste including silver (Ag) or copper (Cu). The configuration of the electronic component 201 will not be further described because it is similar to that of the electronic component 101 of the second embodiment except that the conductors, 12, 21, 23, and 61 are formed using a pasting process in a single-layer structure. The electronic component 201 of the present embodiment provides the same advantage as that of the electronic component 101 of the second embodiment.

Fourth Embodiment

Figure 18:
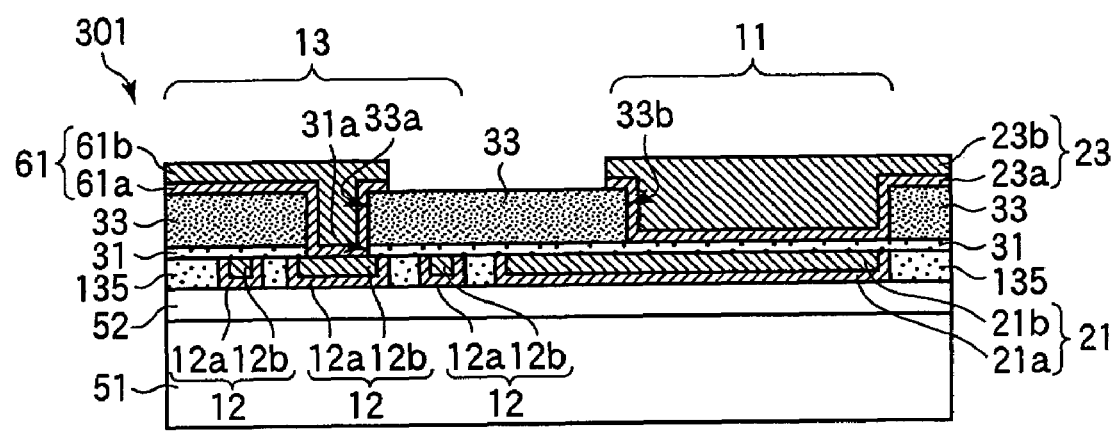
FIG. 18 is a sectional view of an electronic component 301 according to a fourth embodiment of the invention.

An electronic component according to a fourth embodiment of the invention will now be described with reference to FIG. 18. FIG. 18 is a sectional view of an electronic component 301 of the present embodiment.

The electronic component 301 of the present embodiment is characterized in that a bottom conductor 21, a coil conductor 12, a top conductor 23, and a lead-out conductor 61 are formed using a damascene process unlike those in the electronic component 101 of the second embodiment. Underlying conductors 12a and 21a of the coil conductor 12 and the bottom conductor 21 are formed at the bottom and sides of the respective conductors. The configuration of the electronic component 301 will not be further described because it is similar to that of the electronic component 101 of the second embodiment except that the conductors, 12, 21, 23, and 61 are formed using a damascene process and that the underlying conductors 12a and 21a are provided on the sides of the coil conductor 12 and the bottom conductor 21. The electronic component 301 of the present embodiment provides the same advantage as that of the electronic component 101 of the second embodiment.

The invention is not limited to the above-described embodiments and may be modified in various ways.

While the above embodiments have addressed an electronic component including only a capacitor element 11 and an inductor element 13 by way of example, the invention is not limited to such components. For example, the invention may be applied to RC composite type electronic components including a resistive element formed instead of an inductor element 13. The invention may be applied also to RLC composite type electronic components including a resistive element in addition to a capacitor element 11 and an inductor element 13. The invention is not limited to electronic components including only passive elements and may be applied to electronic components including active elements such as a transistor and diode as long as the electronic components include a capacitor element 11. Further, the invention may be applied to digital-analog hybrid circuits as long as the electronic components include a capacitor element 11.

Although the first to fourth embodiments have been described by referring to an electronic component 1 including a capacitor element 11 constituted one layer by way of sample, the invention is not limited to such a structure. For example, the invention may be applied to an electronic component 1 including a multi-layer type capacitor element 11 in which layers having a conductor and a dielectric film 31 are repeatedly stacked. When capacitor elements 11 including layers of dielectric films 31 stacked one over another are to be formed, capacitor elements 11 of the electronic components according to the first to fourth embodiments may be appropriately combined. For example, capacitor elements 11 according to the same embodiment may be repeatedly stacked. Alternatively, capacitor elements 11 according to one embodiment may be repeatedly stacked on a capacitor element 11 according to another embodiment. Further, capacitor elements according to two embodiments may be alternately stacked.

What is claimed is:

1. An electronic component comprising:
   a planarized layer formed on a substrate;
   a first conductor formed on the planarized layer;
   a dielectric film formed substantially throughout the substrate to cover an entire top surface and side surfaces of the first conductor;
   an organic insulation film formed on the dielectric film and having an opening that exposes at least a portion of the dielectric film; and
   a second conductor formed directly on the at least a portion of the dielectric film exposed by the opening in the organic insulation film, the second conductor being in contact with the organic insulation film, formed over the first conductor and forming a capacity in combination with the first conductor and the dielectric film.

2. An electronic component according to claim 1, wherein the organic insulation film is separated from the first conductor by the dielectric film.

3. An electronic component according to claim 1, wherein the dielectric film is planar substantially throughout a surface of the substrate.

4. An electronic component according to claim 1, wherein part of the first and second conductors serves as an electrode of the capacity and wherein an electrode area of the capacity is determined by an area of the opening.

5. An electronic component according to claim 1, wherein the second conductor extends on the organic insulation film from the opening.

6. An electronic component according to claim 1, further comprising a circuit element having a third conductor formed so as to be covered by the dielectric film.

7. An electronic component according to claim 6, wherein the third conductor is formed in a same layer as the first conductor.

8. An electronic component according to claim 6, wherein the circuit element has an inductor element; and
   the capacity and the inductor element are connected in series to form a resonance circuit.

9. An electronic component according to claim 6, further comprising a lead-out conductor formed above the organic insulation film,
   wherein the third conductor has a spiral shape; and
   the lead-out conductor is in contact with an inner end of the third conductor at a via opening that is formed in the dielectric film and the organic insulation film and extends to a side where the second conductor is not formed.

10. An electronic component according to claim 1, wherein the dielectric film is formed substantially throughout a surface of the substrate.

11. An electronic component according to claim 1, wherein a surface of the organic insulation film is planar.

12. An electronic component according to claim 1, wherein the first and second conductors are not formed in a same layer.

13. An electronic component according to claim 1, wherein a thickness of the dielectric film is smaller than a thickness of the first conductor.

14. An electronic component according to claim 1, wherein a thickness of the dielectric film is smaller than a thickness of the organic insulation film.

15. An electronic component according to claim 1, wherein a dielectric constant of the dielectric film is greater than a dielectric constant of the organic insulation film.

16. An electronic component according to claim 1, wherein alumina, silicon nitride or silicon dioxide is used as the material of the dielectric film.

17. An electronic component according to claim 1, wherein the organic insulation film is formed from a photosensitive resin.

18. An electronic component according to claim 1,
   wherein the second conductor includes a lower conductor formed directly on the dielectric layer and an upper conductor made of a material different than the lower conductor and formed directly on the lower conductor.

19. An electronic component according to claim 1,
   wherein the substrate is made of alumina.

20. An electronic component according to claim 1,
   wherein the planarized layer is made of alumina.

21. An electronic component according to claim 1,
   wherein the second conductor is made of copper.

* * * * *